(12) United States Patent
Matsuoka et al.

(10) Patent No.: US 7,586,782 B2
(45) Date of Patent: Sep. 8, 2009

(54) SEMICONDUCTOR MEMORY

(75) Inventors: Hideyuki Matsuoka, Nishitokyo (JP); Riichiro Takemura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 25 days.

(21) Appl. No.: 12/026,979

(22) Filed: Feb. 6, 2008

(65) Prior Publication Data

US 2008/0137403 A1 Jun. 12, 2008

Related U.S. Application Data

(63) Continuation of application No. 11/547,616, filed as application No. PCT/JP2005/006469 on Apr. 1, 2005, now Pat. No. 7,372,726.

(30) Foreign Application Priority Data

Apr. 8, 2004 (JP) ............................. 2004-113889

(51) Int. Cl.
*G11C 11/00* (2006.01)
(52) U.S. Cl. ...................... 365/163; 365/226
(58) Field of Classification Search ................. 365/163, 365/226

See application file for complete search history.

(56) References Cited

U.S. PATENT DOCUMENTS

| | | | |
|---|---|---|---|
| 6,930,912 B2 | 8/2005 | Inui | |
| 7,154,788 B2 * | 12/2006 | Takemura et al. | 365/189.05 |
| 7,236,388 B2 | 6/2007 | Hosoi et al. | |
| 7,492,644 B2 * | 2/2009 | Takemura et al. | 365/189.05 |
| 2004/0184331 A1 * | 9/2004 | Hanzawa et al. | 365/203 |
| 2004/0233748 A1 * | 11/2004 | Terao et al. | 365/202 |
| 2005/0119418 A1 | 6/2005 | Matsumoto et al. | |
| 2006/0081941 A1 | 4/2006 | Iwata et al. | |
| 2006/0081961 A1 | 4/2006 | Tanaka et al. | |
| 2008/0258129 A1 * | 10/2008 | Toda | 257/5 |

* cited by examiner

*Primary Examiner*—Michael T Tran
(74) *Attorney, Agent, or Firm*—Miles & Stockbridge P.C.

(57) ABSTRACT

A phase-change memory for employing chalcogenide as a recording medium is disclosed, which prevents the read disturbance from being generated, and reads data at high speed. In a phase-change memory cell array including a selection transistor and chalcogenide, a substrate potential of the selection transistor is isolated in a direction perpendicular to the word lines. During the data recording, a forward current signal flows between the substrate and the source line connected to chalcogenide, and the selection transistor is not used. During the data reading, a desired cell is selected by the selection transistor. Therefore, a recording voltage is greatly higher than the reading voltage, such that the occurrence of read disturbance is prevented, and a high-speed operation is implemented.

7 Claims, 21 Drawing Sheets

CROSS SECTIONAL VIEW
ALONG THE LINE A-A IN FIG.5

CROSS SECTIONAL VIEW
ALONG THE LINE B-B IN FIG.8

CROSS SECTIONAL VIEW ALONG THE LINE B-B IN FIG.10

CROSS SECTIONAL VIEW ALONG THE LINE B-B IN FIG.12

CROSS SECTIONAL VIEW ALONG THE LINE B-B IN FIG.14

11  14  11    11  14  11    11  14  11  6

11  14  11    11  14  11    11  14  11  6

CROSS SECTIONAL VIEW
ALONG THE LINE A-A IN FIG.21

CROSS SECTIONAL VIEW
ALONG THE LINE B-B IN FIG.35

SEMICONDUCTOR MEMORY

CROSS-REFERENCE TO RELATED APPLICATION

This application is a continuation of application Ser. No. 11/547,616 filed Oct. 5, 2006 now U.S. Pat. No. 7,372,726, which is a 371 of PCT/JP05/06469 filed Apr. 1, 2005.

TECHNICAL FIELD

The present invention relates to a semiconductor memory, and more particularly to a non-volatile random access memory (RAM) operated at low voltage at high speed.

BACKGROUND ART

With the increasing demands of mobile devices such as mobile phones, non-volatile memories and associated technology are being rapidly researched by many developers throughout the world. A representative example of the non-volatile memory is a flash memory. The flash memory is operated at low speed, such that it has been widely used as a programmable ROM.

In the meantime, a high-speed DRAM is required for an operation memory. A memory for portable or mobile devices includes not only the flash memory but also the DRAM. If a semiconductor device including characteristics of the above-mentioned two memories (i.e., the flash memory and the DRAM) can be implemented, the flash memory and the DRAM can be integrated into a single chip, and this integrated chip can substitute for all the semiconductor memories, resulting in the increasing advantages of the integrated chip of the flash memory and the DRAM.

A representative memory based on a phase change (i.e., a phase-change memory) has been disclosed in 2001 EDM (International Electron Device Meeting) by Intel Corporation.

The principles of the operations of the above-mentioned phase-change memory will be described in detail. The phase-change memory uses a material called "chalcogenide" as a memory node. The chalcogenide has different resistances according to crystal states. The chalcogenide is a material used for a recording medium such as DVD or CD. Representative examples of the chalcogenide are a Ge—Sb—Te-based material and an Ag—In—Sb—Te-based material, which include at least antimony (Sb) and tellurium (Te). A basic memory cell includes a selection transistor and the chalcogenide. In other words, the basic memory is similar to the DRAM cell, and may be considered to be a specific memory capable of replacing a capacitor with the chalcogenide. The crystal of the chalcogenide is configured in the form of a single crystal or amorphous material. The chalcogenide has different resistances changing from 10 times to 10,000 times. The chalcogenide is configured in the form of a solid memory using the difference in resistances. For example, since a magnetic RAM (MRAM) acting as a non-volatile memory has a resistance-change rate of about 40%, the phase-change memory has a greater resistance-change rate higher than that of the MRAM, such that the phase-change memory can more easily detect data than the MRAM.

In order to change a crystal state of the chalcogenide to another state, Joule heat created by the voltage is used. In order to change the chalcogenide to the amorphous material, the chalcogenide is heated at about 600° C., such that the chalcogenide is melted and is rapidly cooled. In order to crystallize the chalcogenide, it is maintained at a temperature of about 400° C. for a predetermined time of about 50 nsec. Therefore, the pulse shown in FIG. 2 is assigned to the data recording. In the case of reading the data, a word line is switched on, and two-value information ("0" and "1") is identified by a current signal flowing between a common ground line and a bit line.

A representative phase-change memory capable of changing a crystal state of the chalcogenide to another state by a current signal received from a diode has been disclosed in U.S. Pat. Nos. 5,166,758 and 5,536,947. Another representative phase-change memory for connecting a transistor to the chalcogenide in the form of a cascade, allowing a current signal to be generated from the transistor, and changing a crystal state of the chalcogenide to another state has been disclosed in "2002 ISSCC, 12.4 Ovonic Unified Memory", p 202 on 2002, proposed by M. Grill.

DISCLOSURE OF THE INVENTION

Therefore, the present invention has been made in view of the above problems, and it is an object of the invention to provide a semiconductor memory for preventing the occurrence of data-read disturbance.

FIG. 3 is a structural diagram illustrating a memory cell according to the present invention. From the viewpoint of performance and costs, a memory cell transistor employs a logic-core MOS. As a result, in the case of using an exemplary node of 90 nm, the bit line voltage is 1.0V. Referring to FIG. 4, in the case of recording data, the memory according to the present invention employs two bit line voltages and two times. In the meantime, in the case of reading data, a low bit voltage sufficiently less than a record voltage must be applied to the memory cell, such that it prevents the occurrence of read disturbance, resulting in no lost-or damaged-data in the memory cell. However, a microprocessor (also called a microcomputer) for use in vehicles must be operated at high speed, and a read bit line voltage increases to implement the high-speed operation of the microprocessor, such that the value of a cell current signal must also increase. In other words, in the case of conventional memory cells, the implementation of the high-speed cell and the prevention of read disturbance are traded off, such that the conventional memory cells have limitation in implementing the high-speed performance of the cell.

In accordance with an aspect of the present invention, the above and other objects can be accomplished by the provision of a cell array in which a cell transistor is not used for the data recording. FIG. 1 shows a memory array according to the present invention. In the case of recording data, a forward bias is applied between the substrate and the source line of a selected cell. In this case, in order to suppress a leak current of a non-selection cell, a voltage shown in FIG. 1 is employed. According to the present invention, a record voltage can be higher than a withstanding voltage of the transistor, as denoted by "2V" in FIG. 1. Therefore, a read voltage increases, the increased read voltage prevents a read disturbance from being generated, and a cell current signal also increases. In this case, the voltage between the word and bit lines of the selected cell becomes higher than a withstanding voltage guaranteed for 10 years, however, there is no problem on the condition that an embedded microcomputer is used, as depicted in a right lower side of FIG. 1.

The present invention provides a phase-change memory including a selection transistor and chalcogenide. During the data reading, a maximum voltage indicating a threshold voltage can be applied to the selection transistor, such that data can be read at high speed. Also, the record voltage can be higher than the withstanding voltage of the selection transistor, such that a margin between the read and record voltages can be sufficiently guaranteed, resulting in the prevention of the occurrence of read disturbance. As a result, a non-volatile memory of high-reliability and high-performance is implemented. Specifically, the present invention can be effectively applied to a system LSI including the non-volatile memories.

BRIEF DESCRIPTION OF DRAWINGS

The above and other objects, features and other advantages of the present invention will be more clearly understood from the following detailed description taken in conjunction with the accompanying drawings, in which.

BEST MODE FOR CARRYING OUT THE INVENTION

Figure 1:
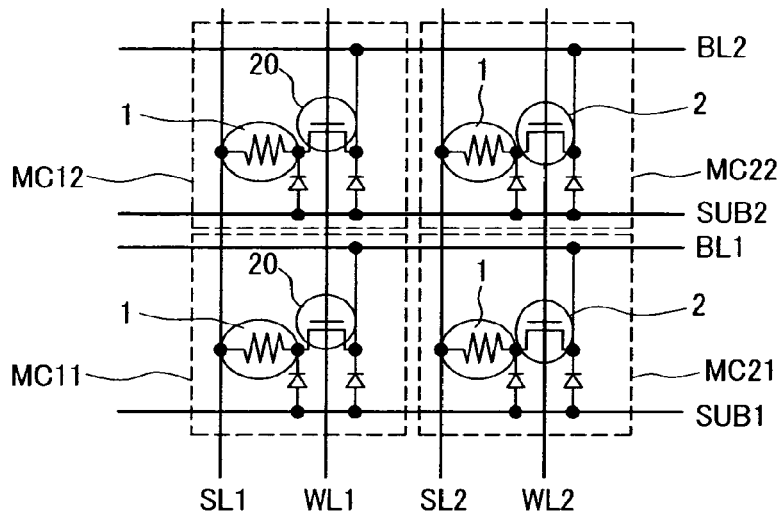
FIG. 1 is a structural diagram illustrating a memory array according to the present invention.
Figure 2:
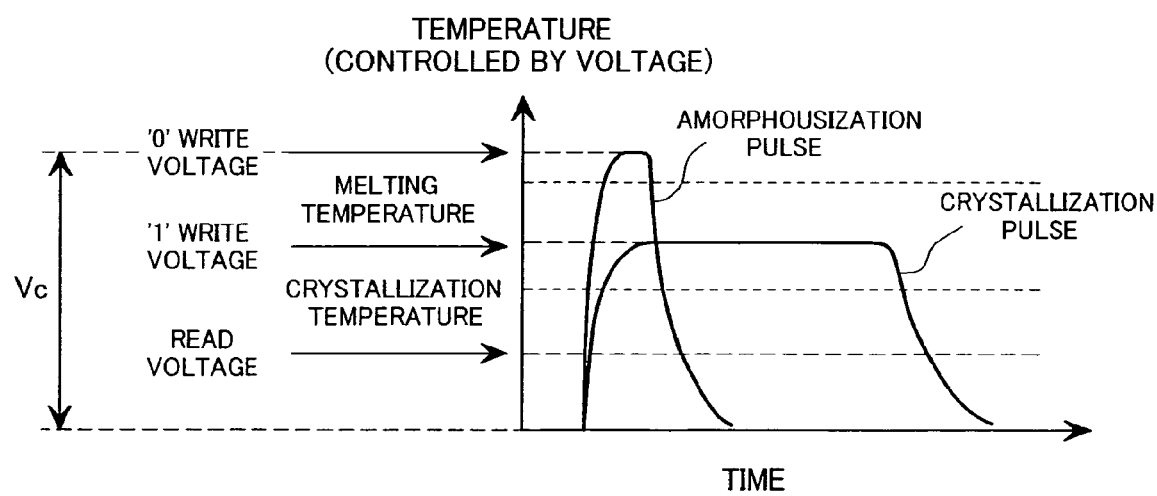
FIG. 2 is a conceptual diagram illustrating a method for recording data in a phase-change memory according to the present invention.
Figure 3:
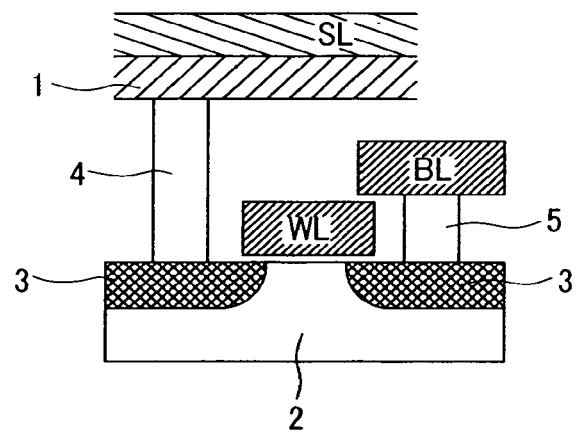
FIG. 3 is a structural diagram illustrating a conventional phase-change memory cell.
Figure 4:
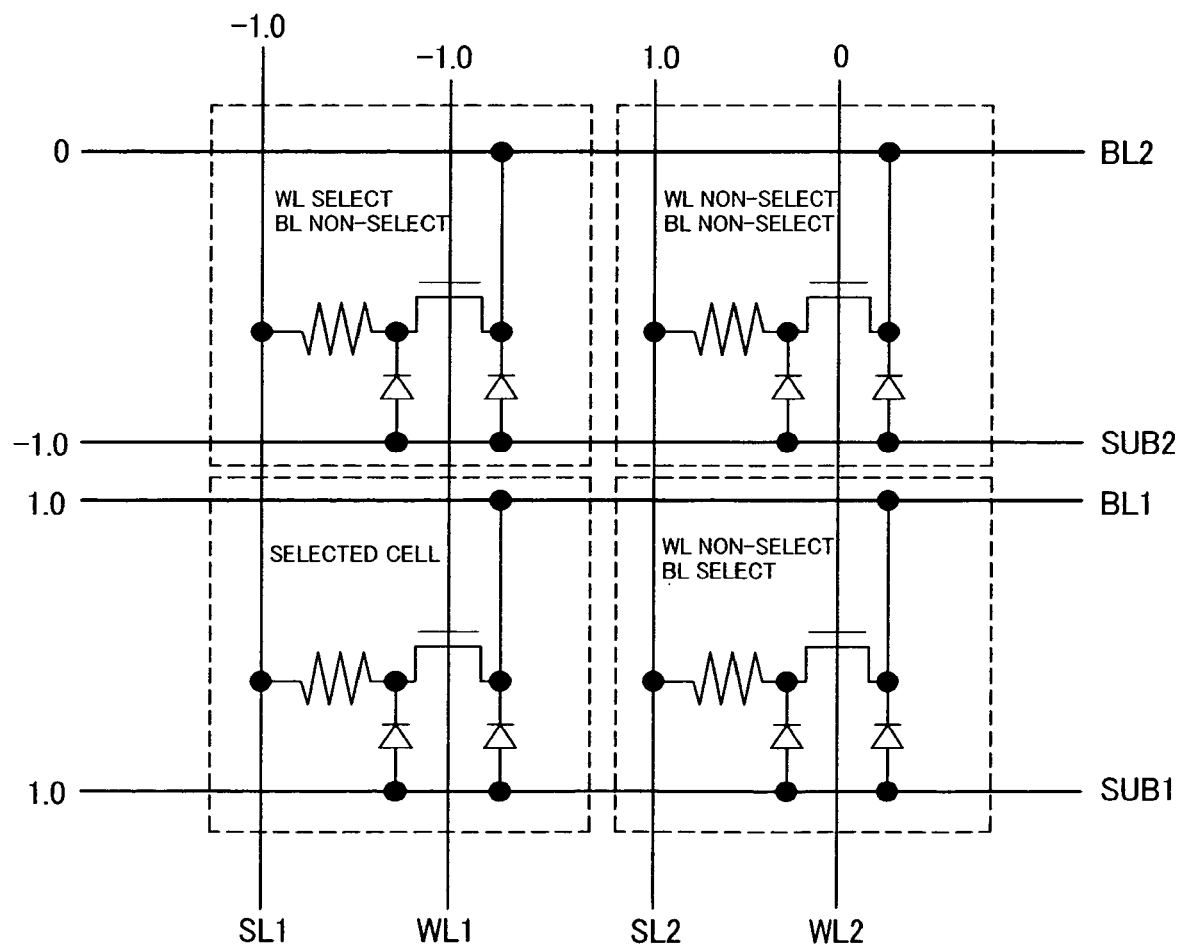
FIG. 4 is a conceptual diagram illustrating a method for applying a voltage to a memory array according to the present invention.

Now, preferred embodiments of the present invention will be described in detail with reference to the annexed drawings. In the drawings, the same or similar elements are denoted by the same reference numerals even though they are depicted in different drawings. In the following description, a detailed description of known functions and configurations incorporated herein will be omitted when it may make the subject matter of the present invention rather unclear.

First Preferred Embodiment

Figure 5:
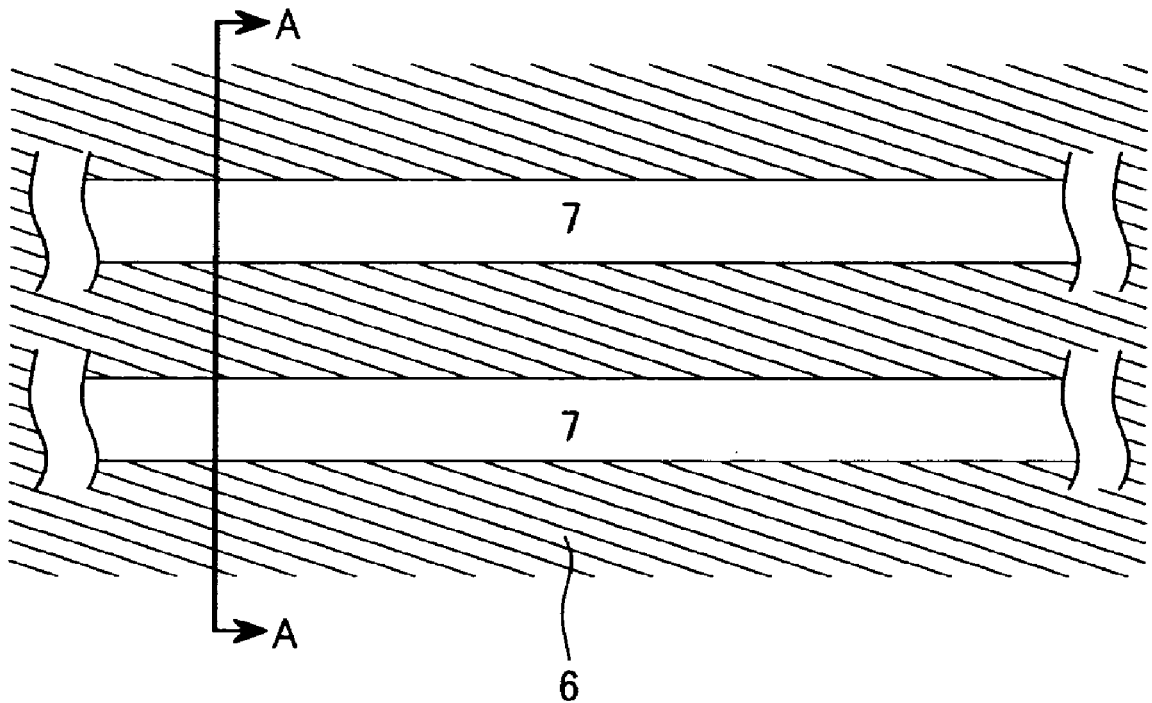
FIG. 5 is a top view illustrating a fabrication process of a semiconductor memory according to a first preferred embodiment of the present invention.

FIG. 1 is a structural diagram illustrating a memory array according to the present invention. A method for fabricating a memory array of FIG. 1 will hereinafter be described according to a fabrication process of the memory array. FIG. 1 shows only the memory array. An isolation layer 6 is formed as shown in FIG. 5. FIG. 5 is a top view illustrating a fabrication process of a semiconductor memory according to a first preferred embodiment of the present invention. In order to form the isolation layer 6, a trench groove is formed in a silicon substrate by general photolithography and dry-etching processes. A CMOS well is formed by a general fabrication method. An N-type well is formed in a memory array. In order to implement the memory array of FIG. 1, a substrate potential of the cell array is separated in the direction parallel to a bit line. For this purpose, only the memory array is exposed by the general photolithography, and a p-type diffusion layer 8 is deposited under the isolation layer 7 by impurity implantation.

Figure 6:
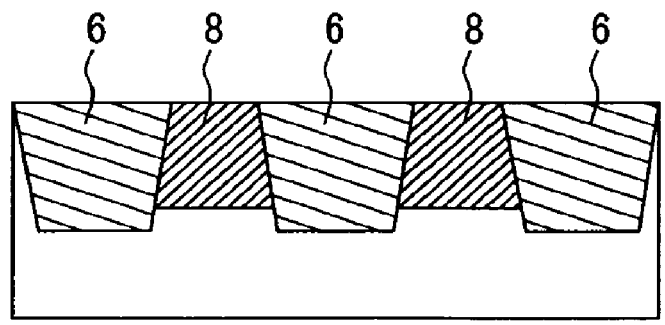
FIG. 6 is a cross-sectional view illustrating a fabrication process of a semiconductor memory according to a first preferred embodiment of the present invention.

FIG. 6 is a cross-sectional view illustrating a semiconductor memory taken along the line A-A of FIG. 5. Referring to FIG. 6, the impurity implantation layer 8 is thinner than the isolation layer 6, such that the substrate potential of the array can be self-aligned-isolated by the isolation layer 6. Therefore, according to the first preferred embodiment of the present invention, there is no need to increase an interval between bit lines to guarantee the alignment, such that the memory cell area is not increased.

Figure 7:
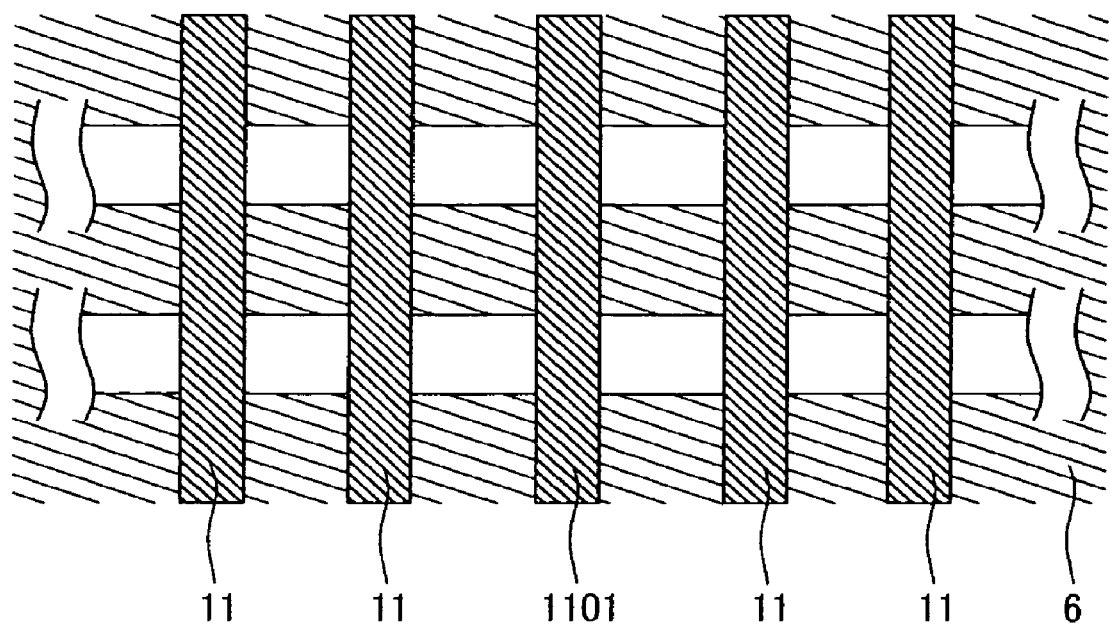
FIG. 7 is a top view illustrating a fabrication process of a semiconductor memory according to a first preferred embodiment of the present invention.

Next, word lines 11 and 1101 are formed according to a typical CMOS process, as shown in FIG. 7. FIG. 7 is a top view illustrating a fabrication process of a semiconductor memory according to a first preferred embodiment of the present invention. Furthermore, in order to form a diffusion layer of a transistor, the word lines 11 and 1101 are used as masks, the n-type impurity is implanted by general ion implantation, and an annealing process for activation is performed. Needless to say, a desired CMOS transistor may also be formed in a peripheral circuit area as necessary. Subsequently, in order to reduce resistance of the word line and resistance of the diffusion layer, a salicide process is performed in the same manner as in the peripheral circuit area. The word line 1101 is adapted to electrically isolate the diffusion layer of a neighboring cell, and a detailed description thereof will be described later. From the viewpoint of the above-mentioned characteristics, the word line 1101 is operated differently from other word lines 11.

Next, source lines (i.e., SL lines of FIG. 1) are formed. In order to form the interlayer insulation layer 13, a silicon oxide layer is deposited with a predetermined thickness of 500 nm, and is planarized by a typical CMP process. A contact hole is exposed to interconnect the SL lines. In order to form a conductive plug 12, tungsten is deposited with a predetermined thickness of 200 nm, and is planarized by the typical CMP process, such that the top view of FIG. 8 is provided.

Figure 8:
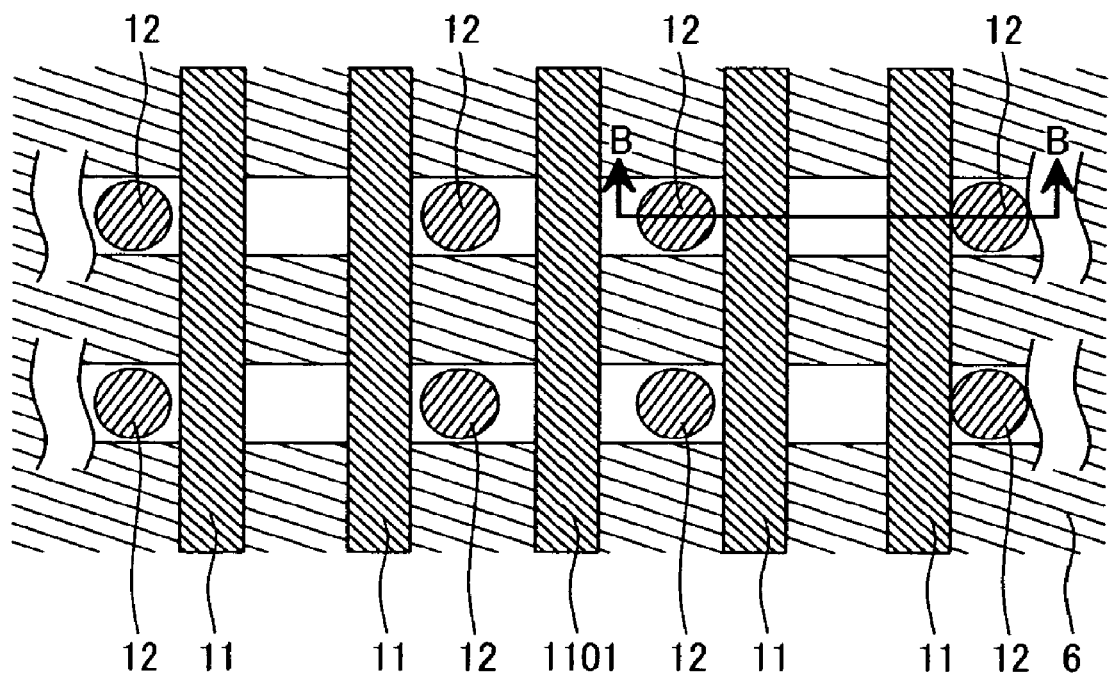
FIG. 8 is a top view illustrating a fabrication process of a semiconductor memory according to a first preferred embodiment of the present invention.
Figure 9:
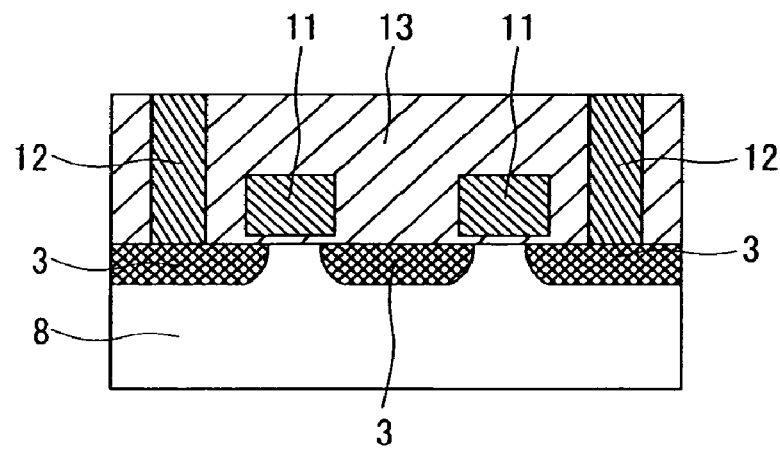
FIG. 9 is a cross-sectional view illustrating a fabrication process of a semiconductor memory according to a first preferred embodiment of the present invention.
Figure 10:
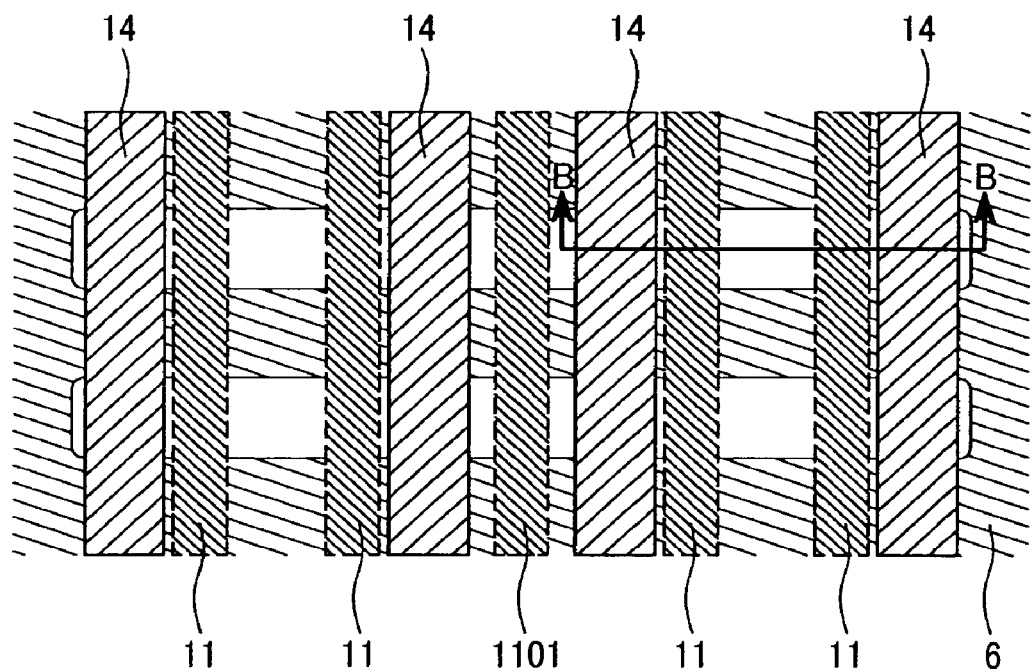
FIG. 10 is a top view illustrating a fabrication process of a semiconductor memory according to a first preferred embodiment of the present invention.
Figure 11:
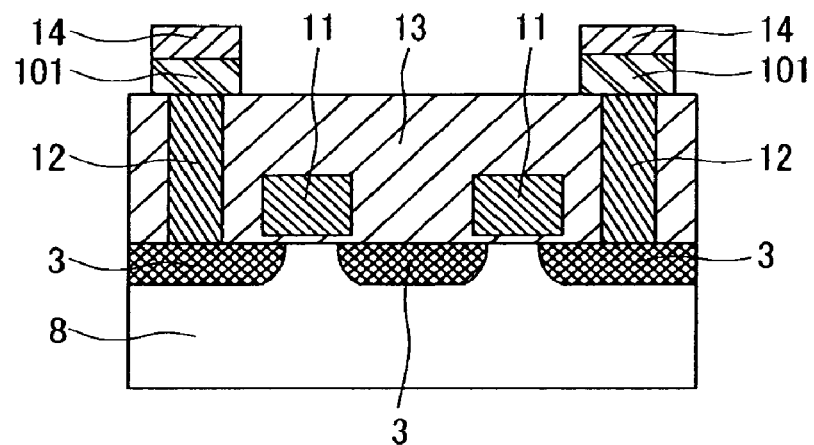
FIG. 11 is a cross-sectional view illustrating a fabrication process of a semiconductor memory according to a first preferred embodiment of the present invention.

FIG. 8 is a top view illustrating a fabrication process of a semiconductor memory according to a first preferred embodiment of the present invention. As can be seen from FIG. 8, there is no interlayer insulation layer in FIG. 8 for the convenience of description. Needless to say, the electric plug 12 may also be composed of other materials other than tungsten. For example, the electric plug 12 is formed of TiN, Ti, Al, or Cu, and may also be configured in the form of a laminated structure of TiN, Ti, Al, and Cu. FIG. 9 is a cross-sectional view illustrating a semiconductor memory taken along the line B-B of FIG. 8. Referring to FIG. 9, the chalcogenide 101 is deposited with a thickness of 50 nm, and the tungsten 14 acting as the SL lines is deposited with a thickness of 100 nm. Subsequently, the laminated layer of the chalcogenide 101 and the tungsten 14 is fabricated by general lithography and dry-etching processes, such that the top view of FIG. 10, and the cross-sectional view of FIG. 11 are provided. Needless to say, the SL line may be formed of TiN, Ti, Al, or Cu, and may also be configured in the form of a laminated structure of TiN, Ti, Al, and Cu.

Figure 12:
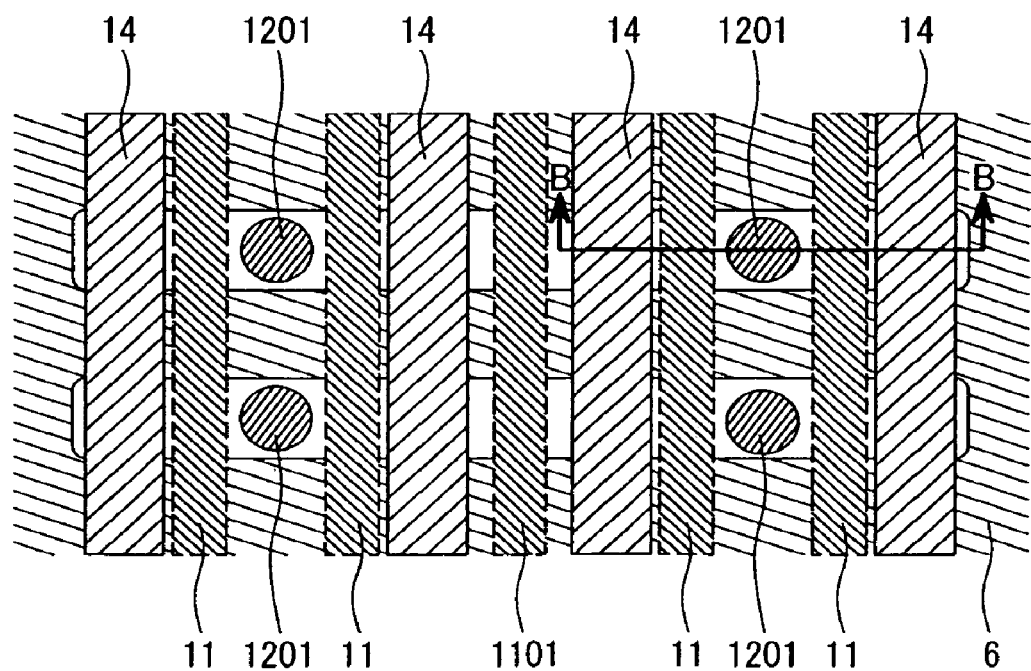
FIG. 12 is a top view illustrating a fabrication process of a semiconductor memory according to a first preferred embodiment of the present invention.
Figure 13:
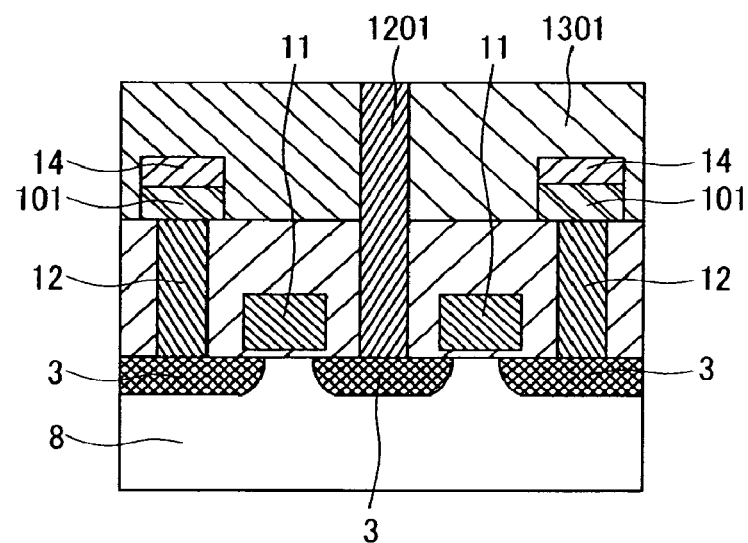
FIG. 13 is a cross-sectional view illustrating a fabrication process of a semiconductor memory according to a first preferred embodiment of the present invention.
Figure 14:
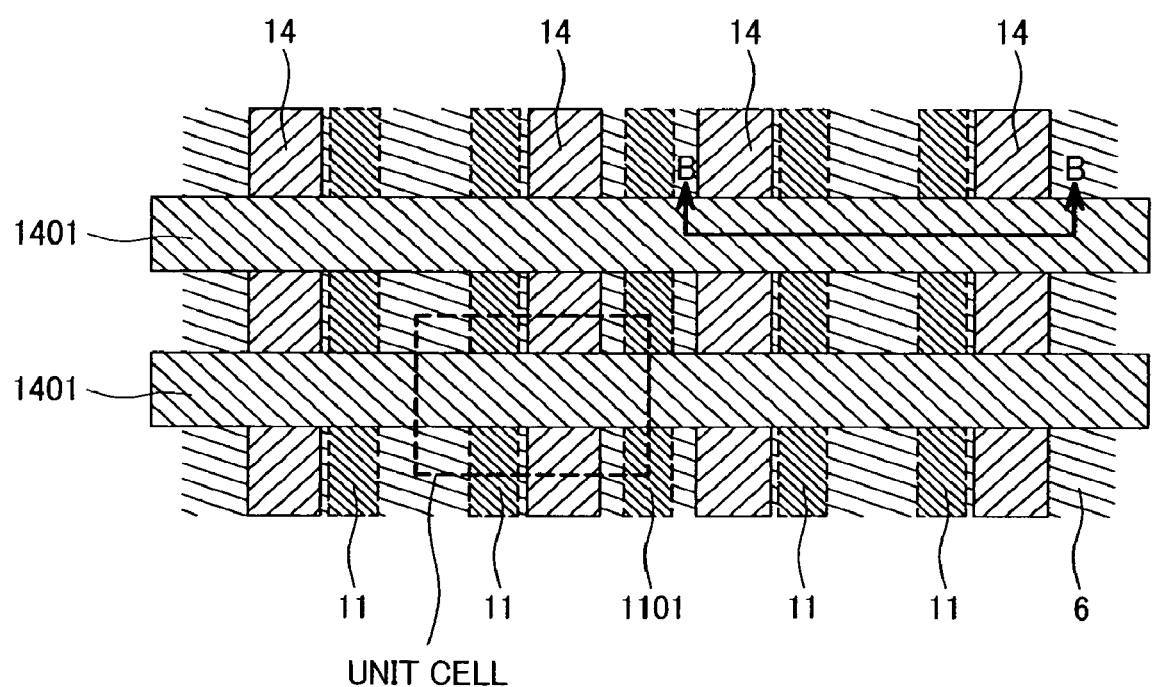
FIG. 14 is a top view illustrating a fabrication process of a semiconductor memory according to a first preferred embodiment of the present invention.
Figure 15:
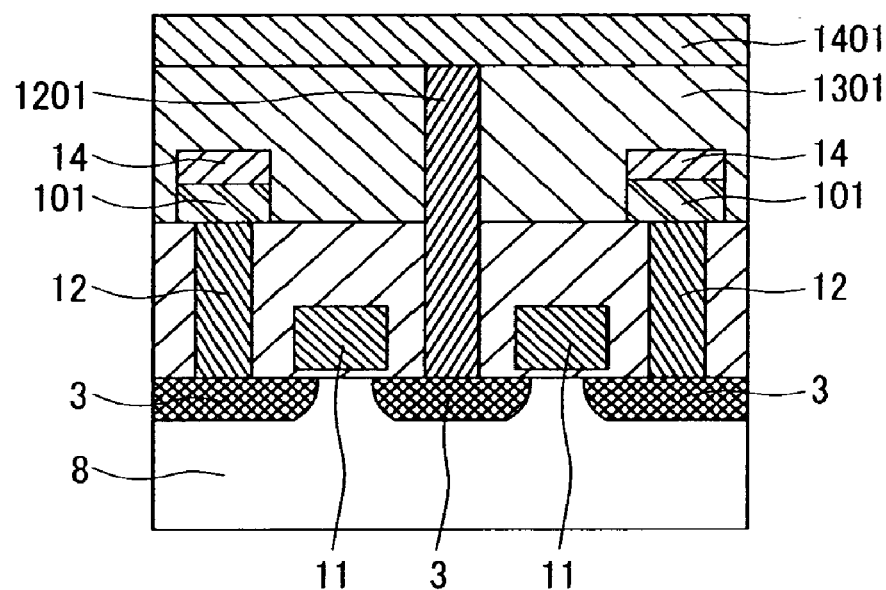
FIG. 15 is a cross-sectional view illustrating a fabrication process of a semiconductor memory according to a first preferred embodiment of the present invention.

Next, the bit line is formed. Similar to the above-mentioned source lines (SL) case, in order to form an interlayer insulation layer 1301, a silicon oxide layer is deposited with a thickness of 500 nm, and is then planarized by a general CMP process. Furthermore, in order to form a conductive plug 1201, tungsten is deposited with a thickness of 200 nm, and is planarized by the typical CMP process, such that the top view of FIG. 12 is provided. Needless to say, the electric plug 1201 may also be composed of other materials other than tungsten. For example, the electric plug 1201 is formed of TiN, Ti, Al, or Cu, and may also be configured in the form of a laminated structure of TiN, Ti, Al, and Cu. As can be seen from FIG. 12, there is no interlayer insulation layer in FIG. 12 for the convenience of description. FIG. 13 is a cross-sectional view illustrating the semiconductor memory taken along the line B-B of FIG. 12. Next, tungsten 1401 acting as the BL line is deposited with a thickness of 100 nm. Subsequently, the tungsten 1401 is fabricated by general lithography and dry-etching processes, such that the top view of FIG. 14 is provided, and the cross-sectional view of FIG. 15 is provided. Needless to say, the BL line may be formed of other material other than tungsten. For example, the BL line may be formed of TiN, Ti, Al, or Cu, and may also be configured in the form of a laminated structure of TiN, Ti, Al, and Cu. Thereafter, a multilayer interconnection layer is formed, such that a desired semiconductor memory is implemented.

Figure 16:
FIG. 16 is an example of a read operation according to a first preferred embodiment of the present invention.

FIG. 16 shows an exemplary read operation for use in the array of FIG. 1 according to the present invention. A method for reading data from a memory cell MC11 located at an intersection point between the word line WL1 and the bit line BL1 is depicted in FIG. 16. Firstly, a bit line connected to the read memory cell has a pre-charge level of the read bit line. In FIG. 16, the bit line has the pre-charge level of 0.5V. A phase status of the chalcogenide layer is not changed at this voltage of 0.5V. A word line WL1 corresponding to the read address is set to a standby-state voltage, for example, 1V. The word line WL1 is set from 0V to 1V indicative of the read selection status voltage. Therefore, a memory cell transistor is switched on. In this case, if the chalcogenide layer has low resistance, the bit line BL1 is discharged to 0V, as denoted by dotted lines of the bit line BL1 of FIG. 16. In the meantime, if the chalcogenide layer has high resistance, the bit line BL1 is maintained in the vicinity of the pre-charge level, as denoted by solid lines of the bit line BL1 of FIG. 16. Although the sense-amplifier (also called the sense-amp) is not depicted in FIG. 1, the sense-amp reads H'/L' states of the bit line BL1, and outputs the read H'/L' states to an external part of the array. If the sense-amp detects the bit-line signal, any data of the bit line BL1 is set to a specific potential equivalent to that of the source line SL1, such that it can prevent a phase status of the chalcogenide layer from being changed to another phase status by a current signal generated by the read operation. Thereafter, the word line WL1 is set to a standby-status voltage, such that the read cycle is terminated.

Figure 17:
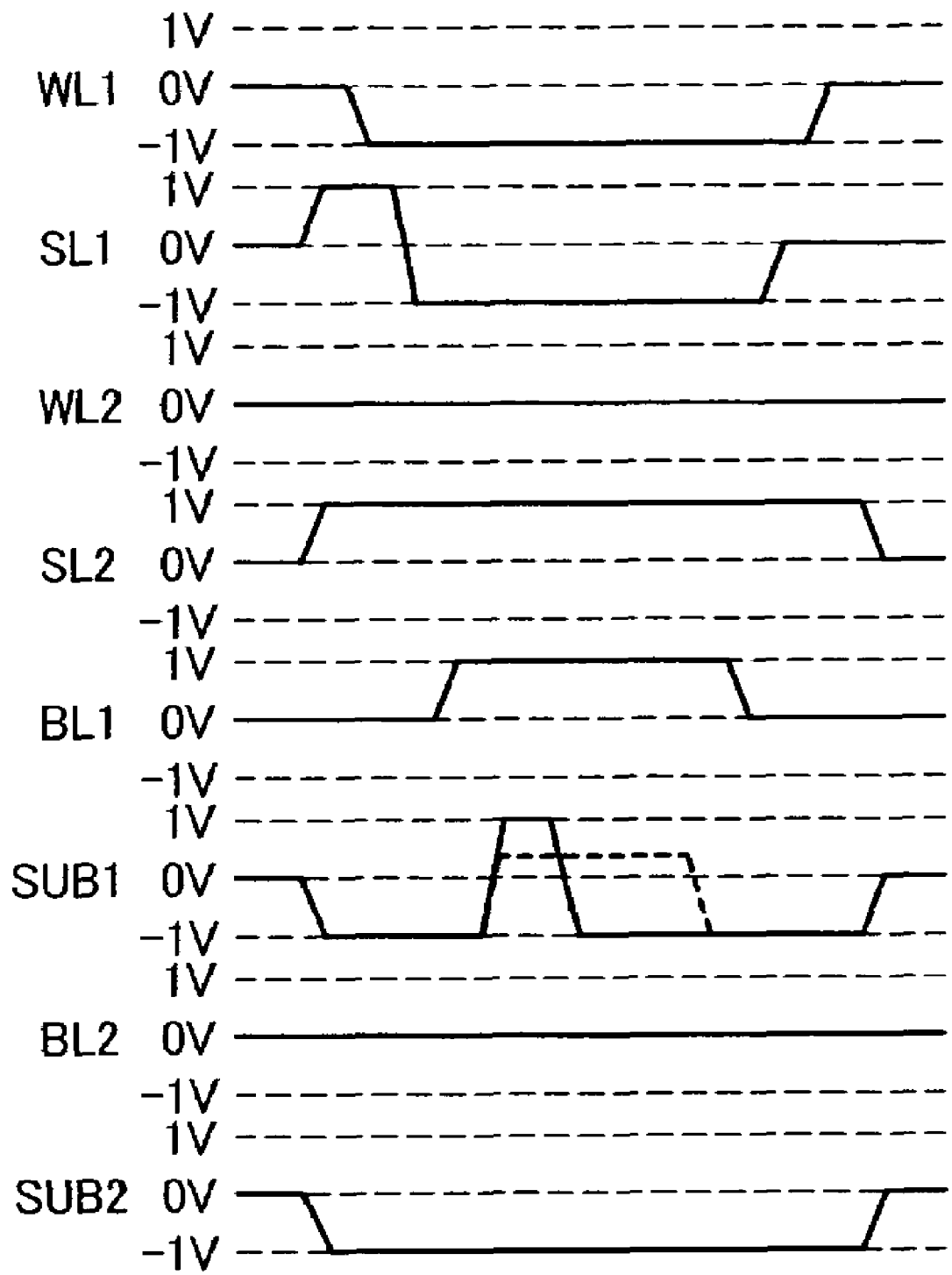
FIG. 17 is an example of a 1-bit record operation according to a first preferred embodiment of the present invention.

An exemplary record operation will hereinafter be described with reference to FIG. 17. FIG. 17 is an example of a 1-bit record operation according to a first preferred embodiment of the present invention. As can be seen from FIG. 17, a phase status of the chalcogenide layer of the memory cell MC11 located at an intersection point between the word line WL1 and the bit line BL1 is changed to another status. Firstly, upon receipt of a record command, substrate potentials (SUB1, SUB2, . . . ) of all the memory cells are set to a standby-status voltage. For example, the substrate potential is set from 0V to −1V provided when the recording is not selected. The source lines (SL1, SL2, ... ) connected to a source node of the memory cell are set to a standby-status voltage, for example, 1V provided when the recording is not selected. Next, the word line WL1 connected to the record-selection cell is set to a non-selection status voltage, for example, from 0V to −1V corresponding to a record-selection status voltage. Thereafter, the source line SL1 connected to the record-selection cell ranges from the record non-selection status voltage to the record-selection status voltage (e.g., −1V). Therefore, the bit line BL1 connected to the record-selection cell MC11 ranges from a standby-status voltage (e.g., 0V) to the record-selection status voltage (e.g., 1V). Therefore, a substrate node SUB1 to which a memory cell transistor connected to the bit line BL1 is commonly connected is driven by record data. In this case, if the record data is created under the condition of the high-resistance chalcogenide layer, the voltage changes from the non-selection status voltage to a reset record voltage (e.g., 1V) as denoted by solid lines of the substrate node (SUB1) waveform of FIG. 17.

In the meantime, if the record data is created under the condition of the low-resistance chalcogenide layer, the voltage changes from the non-selection status voltage to a set record voltage (e.g., 0.5V), as denoted by dotted lines of the substrate node (SUB1) of FIG. 17. A desired voltage is applied to the substrate node (SUB1) during a desired time, and a current signal required for the data recording flows in the chalcogenide layer. Thereafter, the substrate node (SUB1) is set to the record non-selection status voltage. If the substrate node (SUB1) is set to the non-selection status, the bit line BL1 is set to a standby-status voltage. Next, the record selection source line (SL1) enters from the record selection status to the standby-status voltage, the source line is set to the standby status, and then the word line WL1 enters from the record selection status voltage to the standby status voltage. Finally, the record non-selection source line (SL2 . . . ) enters from the record non-selection status to the standby status. In this case, the non-selection substrate node (SUB2 . . . ) enters from the record non-selection status voltage to the standby-status voltage.

Figure 18:
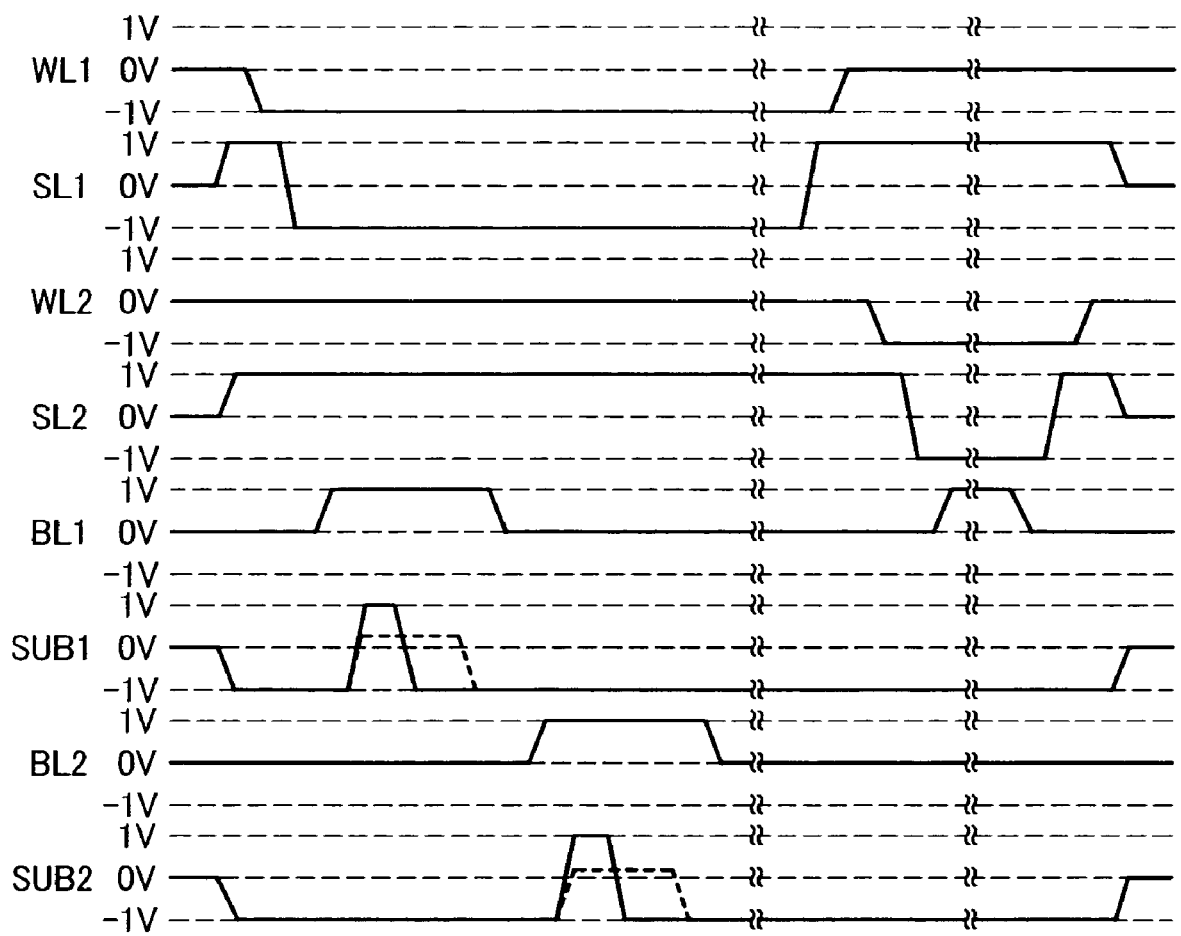
FIG. 18 is an example of a burst record operation according to a first preferred embodiment of the present invention.

FIG. 18 is an example of a burst record operation according to a first preferred embodiment of the present invention. The burst record operation of FIG. 18 sequentially re-writes data in the memory cell of a single word line. As shown in FIG. 18, the standby-status voltages, the record selection status voltages, and the record non-selection status voltages of the bit line, the word line, the source line, and the substrate node are equal to those of FIG. 17. In FIG. 18, data is recorded in memory cells (MC11, MC21, ... ) of the word line WL1, and is recorded in memory cells of the word line WL2. In the same manner as in the above-mentioned example for recording data in the single memory cell, if a record command is received, substrate potentials (SUB1, SUB2, ... ) of all the memory cells change from the standby-status voltage to the record non-selection status voltage, and source lines (SL1, SL2, ... ) connected to the source node of the memory cell enter from the standby-status voltage to the record non-selection status voltage. Next, the record word line (WL1) changes from the standby-status voltage to the record selection status voltage. Next, the record selection source line (SL1) changes from the record non-selection status voltage to the record selection status voltage. Then, a bit line connected to the record memory cell is driven. For example, as shown in FIG. 18, the chalcogenide layer of the memory cell (MC11) has low resistance or high resistance. The bit line (BL1) changes from the standby-status voltage to the record selection status voltage.

Therefore, the substrate node (SUB1) corresponding to the bit line (BL1) is driven by record data. In this case, since the record data is created under the condition of high-resistance chalcogenide layer, the voltage changes from the non-selection status voltage to the reset record voltage. A desired voltage is applied to the substrate node (SUB1) during a desired time, and a current signal required for the data recording flows in the chalcogenide layer. Thereafter, the substrate node (SUB1) is set to the record non-selection status voltage. Then, data is recorded in the memory cell MC12 on the same word line WL1. Similar to the bit line BL1 and the substrate node (SUB1) during the above-mentioned record operation of the memory cell MC11, the bit line (BL2) changes from the standby-status voltage to the record selection status voltage. FIG. 18 shows an exemplary set record operation. The substrate node (SUB2) corresponding to the bit line (BL2) is set to the set record voltage, such that the current signal flows in the chalcogenide layer. If the current signal flows in the chalcogenide layer during a desired time, the substrate node (SUB2) enters from the record selection status to the non-selection status. In this way, the record operation of the memory cell on the same word line WL1 is sequentially executed. At a specific time at which the record operation of the word line WL1 is terminated, the record selection source line (SL1) changes from the record selection status voltage to the record non-selection status voltage.

Thereafter, the word line (WL1) changes from the record selection status voltage to the standby-status voltage. Then, a process for recording data in the memory cell of another word line (e.g., the word line WL2) is executed. After the word line (WL1) enters the standby status, the next record selection word line changes from the standby-status voltage to the record selection status voltage. Thereafter, the source line (SL2) corresponding to the record selection word line changes from the record non-selection status voltage to the record selection status voltage. Similar to the record operation of the memory cell of the above-mentioned word line (WL1), a bit line connected to the record memory cell and a substrate node corresponding to the bit line are sequentially driven according to record data. Therefore, data is recorded in the memory cell of the record selection word line (WL2). If the data is completely recorded in the memory cell of the word line (WL2), the record selection source line (SL2) changes from the record selection status voltage to the record non-selection status voltage in the same manner as in the above-mentioned word line (WL1), and the word line (WL2) enters from the record selection status to the standby status. In the drawings, a specific case in which the record operation is completed is exemplarily depicted. If the word line (WL2) enters the standby status, all the source lines (SL1, SL2, ... ) change from the record non-selection status voltage to the standby-status voltage. Simultaneously, all the substrate nodes (SUB1, SUB2, ... ) change from the record non-selection status voltage to the standby-status voltage. Compared with the example of FIG. 17, the example of FIG. 18 reduces the length of a write cycle (also called a record cycle) when memory cells of the word line are sequentially re-written, and also reduces the length of a write cycle even when data is sequentially re-written in several word lines, such that data can be recorded at high speed. Also, a word line and a source line are not driven for each record cell, such that an amount of power consumption is reduced.

Figure 19:
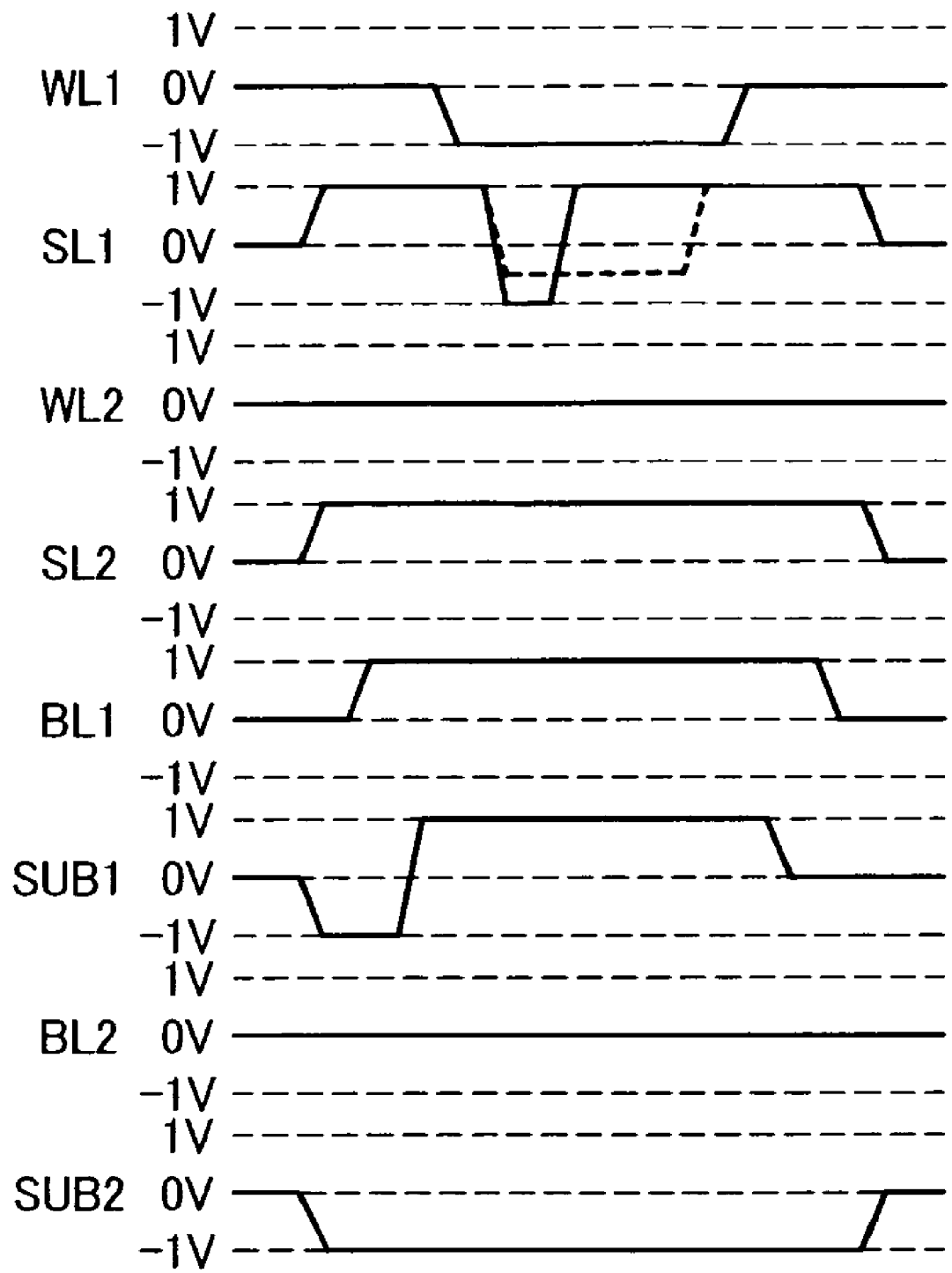
FIG. 19 is an example of a 1-bit record operation according to a first preferred embodiment of the present invention.

FIGS. 17 and 18 show a process for recording data in a single memory cell in a single write cycle. In FIGS. 17 and 18, a plurality of bit lines and substrate nodes corresponding to the bit lines are driven at the same time, such that data can be recorded in the memory cells. In this case, a write or record time of a single word line can be reduced, such that the write cycle can be implemented at high speed. Next, a modified example of the above-mentioned record scheme will hereinafter be described with reference to FIG. 19. FIG. 19 is an example of a 1-bit record operation according to a first preferred embodiment of the present invention. In the above-mentioned record scheme, a record setup voltage of the substrate node is changed according to the record data. In FIG. 19, it is characterized in that the record setup voltage of the source line is changed according to the record data.

The above-mentioned example shows a process for rewriting a phase status of a chalcogenide layer of the memory cell MC11 located at an intersection point between the word line WL1 and the bit line (BL1). Firstly, if a record command is received, the substrate potentials (SUB1, SUB2, . . . ) of all the memory cells change from the standby-status voltage (e.g., 0V) to the record non-selection voltage (e.g., −1V). Simultaneously, source lines (SL1, SL2, . . . ) connected to the source node of the memory cell enters from the standby-status voltage (e.g., 0V) to the record non-selection status voltage (e.g., 1V). Then, the bit line (BL1) connected to the record selection cell (MC11) enters from the standby-status voltage (e.g., 0V) to the record selection voltage (e.g., 1V). Therefore, the substrate node (SUB1) commonly connected to the memory cell transistor connected to the bit line (BL1) enters from the record non-selection status voltage to the record selection status voltage (e.g., 1V), such that it is driven by the record selection status voltage of 1V. Then, the word line (WL1) connected to the record selection memory cell (MC11) enters from the standby-status voltage (e.g., 0V) to the record selection status voltage (e.g., −1V), such that it is driven by the record selection status voltage of −1V. Thereafter, the source line (SL1) connected to the record selection cell is driven by the record data. In this case, if the record data is created by the high-resistance chalcogenide layer, the voltage changes from the record non-selection status voltage to the reset record voltage (e.g., −1V), as denoted by dotted lines of the source lines (SL1) of FIG. 19. In the meantime, if the record data is created by the low-resistance chalcogenide layer, the voltage changes from the record non-selection status voltage to the reset record voltage (e.g., −0.5V), as denoted by solid lines of the source lines (SL1) of FIG. 19. A desired voltage is applied to the source line (SL1) during a desired time, and a current signal required for the recording flows in the chalcogenide layer. Thereafter, the voltage is set to the record non-selection status voltage. If the source line (SL1) is set to the non-selection status, the word line (WL1) is set to the standby-status voltage. Then, the substrate node (SUB1) enters from the record selection status voltage to the standby-status voltage, such that it is driven at the standby-status voltage. If the substrate node (SUB1) is driven at the standby status, then the bit line (BL1) enters from the record selection status voltage to the standby-status voltage.

Finally, the substrate nodes (SUB2 . . . ) of the record non-selection status voltage is set to the standby-status voltage. Simultaneously, the record non-selection source lines (SL2 . . . ) of the record non-selection status voltage is set to the standby-status voltage, such that the recording is terminated.

In the above-mentioned example, the timing point at which the word line (WL1) is set to the selection-status voltage may be provided before the bit line (BL1) is driven at the selection status, or may also be provided before the substrate node (SUB1) is driven at the selection status. In this way, the timing point at which the word line (WL1) of the record selection status enters the standby status may be provided after the substrate node (SUB1) enters the standby status, or may also be provided after the bit line enters the standby status.

Compared with the record schemes of FIGS. 17 and 18, the source line according to the record scheme of FIG. 19 has capacity load less than that of the substrate node, such that control characteristics of the record operation of FIG. 19 are superior to those of FIGS. 17 and 18.

Figure 20:
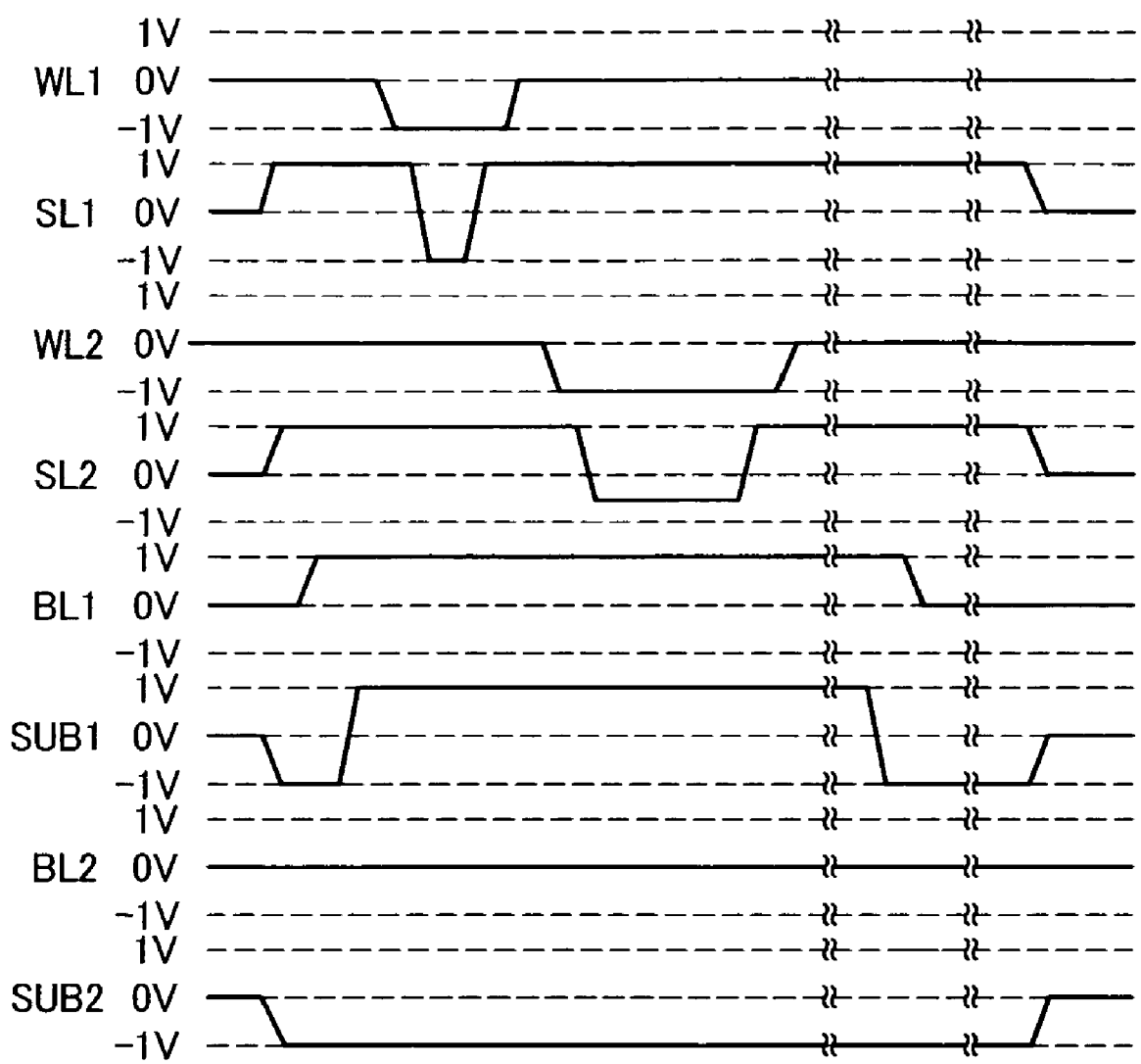
FIG. 20 is an example of a burst record operation according to a first preferred embodiment of the present invention.

Next, a modified example of the above-mentioned record scheme is shown in FIG. 20. FIG. 20 shows a sequential burst record operation associated with data of a memory cell of the bit line. As shown in FIG. 20, the standby-status voltages, the record selection status voltages, and the record non-selection status voltages of the bit line, the word line, the source line, and the substrate node are equal to those of FIG. 19. In FIG. 20, data is recorded in memory cells (MC11, MC21, . . . ) of the bit line BL1, and is recorded in memory cells of the bit line BL2. In the same manner as in the above-mentioned example for recording data in the single memory cell of FIG. 19, if a record command is received, substrate potentials (SUB1, SUB2, . . . ) of all the memory cells change from the standby-status voltage to the record non-selection status voltage, and source lines (SL1, SL2, . . . ) connected to the source node of the memory cell enter from the standby-status voltage to the record non-selection status voltage. Next, the record bit line (BL1) changes from the standby-status voltage to the record selection status voltage. Next, the record selection substrate node (SUB1) changes from the record non-selection status voltage to the record selection status voltage. Then, a bit line connected to the record memory cell is driven. For example, as shown in FIG. 20, the chalcogenide layer of the memory cell (MC11) has low resistance or high resistance. The word line (WL1) changes from the standby-status voltage to the record selection status voltage. Therefore, the source line (SL1) is driven by record data. In this case, since the record data is created under the condition of high-resistance chalcogenide layer, the voltage changes from the non-selection status voltage to the reset record voltage. A desired voltage is applied to the substrate node (SUB1) during a desired time, and a current signal required for the data recording flows in the chalcogenide layer. Thereafter, the substrate node (SUB1) is set to the record non-selection status voltage.

Then, data is recorded in the memory cell MC21 on the same bit line BL1. Similar to the word line WL1 and the source line (SL1) during the above-mentioned record operation of the memory cell MC11, the word line (WL2) changes from the standby-status voltage to the record selection status voltage. The source line (SL2) is set to either the set record voltage or the reset record voltage according to the record data, such that the current signal flows in the chalcogenide layer. If the current signal flows in the chalcogenide layer during a desired time, the source line (SL2) enters from the record selection status to the non-selection status. In this way, the record operation of the memory cell on the same bit line (BL1) is sequentially executed. At a specific time at which the record operation of the bit line (BL1) is terminated, the record selection substrate node (SUB1) changes from the record selection status voltage to the record non-selection status voltage.

Thereafter, the bit line (BL1) changes from the record selection status voltage to the standby-status voltage. Then, a process for recording data in the memory cell of another bit line (e.g., the bit line BL2) is executed. After the bit line (BL1) enters the standby status, the next record selection bit line (BL2) changes from the standby-status voltage to the record selection status voltage. Thereafter, the substrate node (SUB2) corresponding to the record selection bit line changes from the record non-selection status voltage to the record selection status voltage. Similar to the record operation of the memory cell of the above-mentioned bit line (BL1), a word line connected to the record memory cell and a source line corresponding to the word line are sequentially driven according to record data. Therefore, data is recorded in the memory cell of the record selection bit line (BL2). If the data is completely recorded in the memory cell of the bit line (BL2), the record selection substrate node (SUB2) changes from the record selection status voltage to the record non-selection status voltage in the same manner as in the above-mentioned bit line (BL1), and the bit line (BL2) enters from the record selection status to the standby status. In the drawings, a specific case in which the record operation is completed is exemplarily depicted. If the bit line (BL2) enters the standby status, all the substrate nodes (SUB1, SUB2, ... ) change from the record non-selection status voltage to the standby-status voltage. Simultaneously, all the source lines (SL1, SL2, ... ) change from the record non-selection status voltage to the standby-status voltage. Compared with the example of FIG. 19, the example of FIG. 20 reduces the length of a write cycle (also called a record cycle) when memory cells of the bit line are sequentially re-written, and also reduces the length of a write cycle even when data is sequentially re-written in several bit lines, such that data can be recorded at high speed. Also, a bit line and a substrate node are not driven for each record cell, such that an amount of power consumption is reduced.

Figure 21:
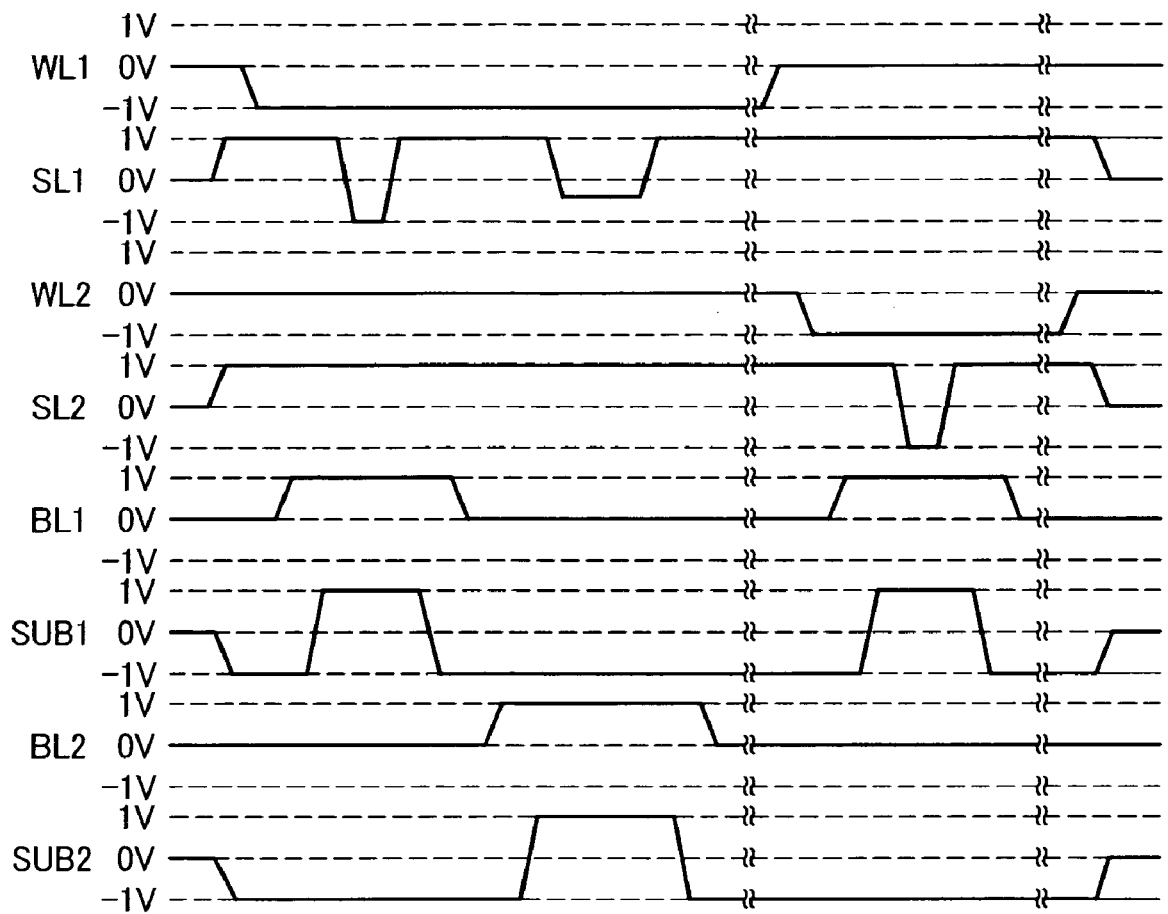
FIG. 21 is an example of a burst record operation according to a first preferred embodiment of the present invention.

Next, a modified example of the above-mentioned record scheme of FIG. 20 is shown in FIG. 21. FIG. 21 shows a method for sequentially selecting a bit line of a memory cell of a word line, and at the same time recording data according to a burst record operation. As shown in FIG. 21, the standby-status voltages, the record selection status voltages, and the record non-selection status voltages of the bit line, the word line, the source line, and the substrate node are equal to those of FIG. 19. In FIG. 21, data is recorded in memory cells (MC11, MC21, ... ) of the word line WL1, and is recorded in memory cells of the word line (WL2). In the same manner as in the above-mentioned example for recording data in the single memory cell of FIG. 19, if a record command is received, substrate potentials (SUB1, SUB2, ... ) of all the memory cells change from the standby-status voltage to the record non-selection status voltage, and source lines (SL1, SL2, ... ) connected to the source node of the memory cell enter from the standby-status voltage to the record non-selection status voltage. Next, the bit line connected to the record memory cell changes from the standby-status voltage to the record selection status voltage. Next, the bit line connected to the record memory cell changes from the standby-status voltage to the record selection status voltage. Then, a bit line connected to the record memory cell enters from the standby-status voltage to the record selection status voltage. Therefore, the substrate node (SUB1) commonly connected to the memory cell transistor connected to the bit line (BL1) enters from the record non-selection status voltage to the record selection status voltage. Then, the source line (SL1) connected to the record cell is driven by the record data. In this case, the chalcogenide layer of the memory cell (MC11) has high resistance. In this case, the source line (SL1) changes from the record non-selection status voltage to the reset operation voltage. A desired voltage is applied to the source line (SL1) during a desired time, and a current signal required for the recording flows in the chalcogenide layer. Thereafter, the source line (SL1) is set to the record non-selection status voltage. Then, data is recorded in the memory cell (MC12) on the same word line (WL1). Similar to the bit line BL1, the substrate node (SUB1), and the source line (SL1) during the above-mentioned record operation of the memory cell MC11, the bit line (BL2) changes from the standby-status voltage to the record selection status voltage. Thereafter, the substrate node (SUB2) corresponding to the bit line (BL2) is set to the record selection status voltage, such that the source line (SL1) connected to the record cell is driven y the record data. FIG. 21 exemplarily shows a process for providing the low-resistance chalcogenide layer. In this case, the source line (SL1) enters from the non-selection status voltage to the set operation voltage, such that it is driven at the set operation voltage, and makes a current signal flow in the chalcogenide layer. After the current signal flows in the chalcogenide layer during a desired time, the source line (S11) enters from the record selection status to the non-selection status. Thereafter, the substrate node (SUB2) changes from the selection status voltage to the non-selection status voltage, and the bit line (BL2) enters from the record selection status voltage to the standby-status voltage. In this way, the record operation of the memory cell on the same word line (WL1) is sequentially executed. At a specific time at which the record operation of the word line WL1 is terminated, the word line (S11) changes from the record selection status voltage to the standby-status voltage. Then, a process for recording data in the memory cell of another word line (e.g., the word line WL2) is executed, and a detailed description thereof will hereinafter be described. After the word line (WL1) enters the standby status, the word line (WL2) acting as the next record selection word line changes from the standby-status voltage to the record selection status voltage. Similar to the record operation of the memory cell of the above-mentioned word line (WL1), a bit line connected to the record memory cell and a substrate node corresponding to the bit line are sequentially driven at the record selection status voltage, a source line is driven, and the current signal flows in the chalcogenide layer, such that data is recorded in the memory cell. Therefore, data is recorded in the memory cell of the record selection word line (WL2). If the data recording is completed at the word line (WL2), the word line (WL2) enters from the record selection status to the standby status in the same manner as in the above-mentioned word line (WL1). In the drawings, a specific case in which the record operation is completed is exemplarily depicted. If the word line (WL2) enters the standby status, all the source lines (SL1, SL2, ... ) change from the record non-selection status voltage to the standby-status voltage. Simultaneously, all the substrate nodes (SUB1, SUB2, ...) change from the record non-selection status voltage to the standby-status voltage. Compared with the example of FIG. 19, the example of FIG. 21 reduces the length of a write cycle (also called a record cycle) when memory cells of the word line are sequentially re-written, and also reduces the length of a write cycle even when data is sequentially re-written in several word lines, such that data can be recorded at high speed. Also, a word line and a source line are not driven for each record cell, such that an amount of power consumption is reduced. In addition, compared with the example of FIG. 20, the example of FIG. 21 has an advantage in that it can transmit or receive data in word-line units in the same manner as in the reading operation.

In this preferred embodiment of the present invention, the word line 1101 is located between two components, such that it is used to isolate the components from each other. In more detail, 0 or negative potential is assigned to the electrode 1101, such that two components are electrically isolated from each other, thereby guaranteeing a normal operation of a memory. This preferred embodiment can prevent a cell area from being increased, and connects a component formation area 7 in a direction parallel to the bit line.

Second Preferred Embodiment

Figure 22:
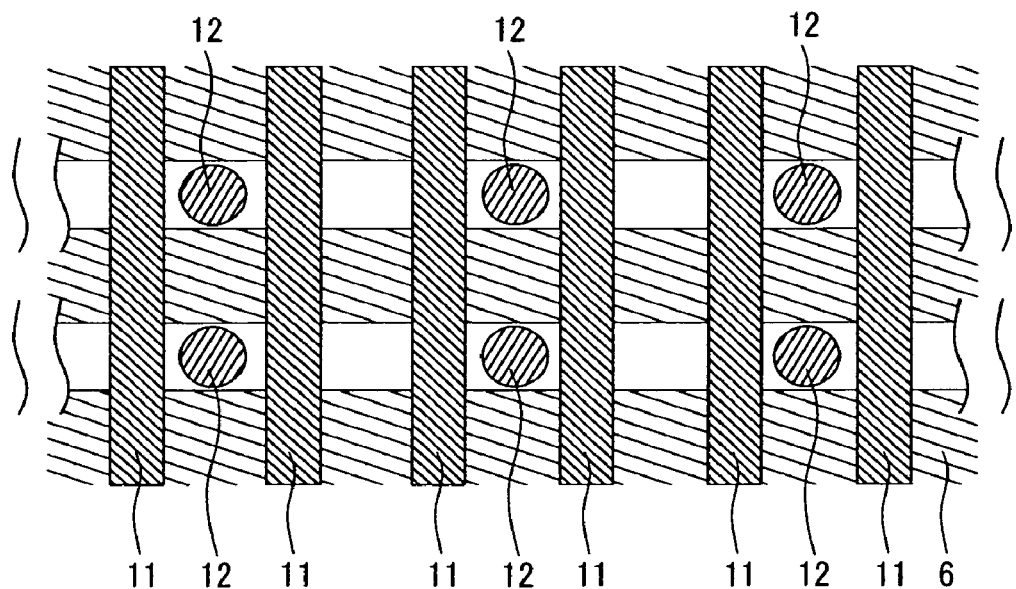
FIG. 22 is a top view illustrating a fabrication process of a semiconductor memory according to a second preferred embodiment of the present invention.

The second preferred embodiment of the present invention relates to a method for implementing a phase-change memory array having superior noise resistance. For this purpose, the second preferred embodiment of the present invention employs a folded bit-line arrangement (i.e., a memory array including two intersection points) widely used for DRAMs. A fabrication process of the second preferred embodiment is almost similar to that of the first preferred embodiment. Also, the second preferred embodiment also uses a method for isolating each component using a gate electrode in the same manner as in the first preferred embodiment. The fabrication method of the second preferred embodiment will hereinafter be described with reference to the annexed drawings. A method for isolating each component, a method for forming a word-line electrode, and a method for forming an impurity diffusion layer of the second preferred embodiment are equal to those of the first preferred embodiment, and are depicted in FIGS. 5, 6, and 7. An interlayer insulation layer is formed and planarized, and a contact hole is exposed to interconnect the SL lines. In order to form a conductive plug 12, tungsten is deposited with a predetermined thickness of 200 nm, and is planarized by the typical CMP process, such that the top view of FIG. 22 is provided. Compared with the example of FIG. 8, the location of the conductive plug 12 is different from that of the first preferred embodiment.

Figure 23:
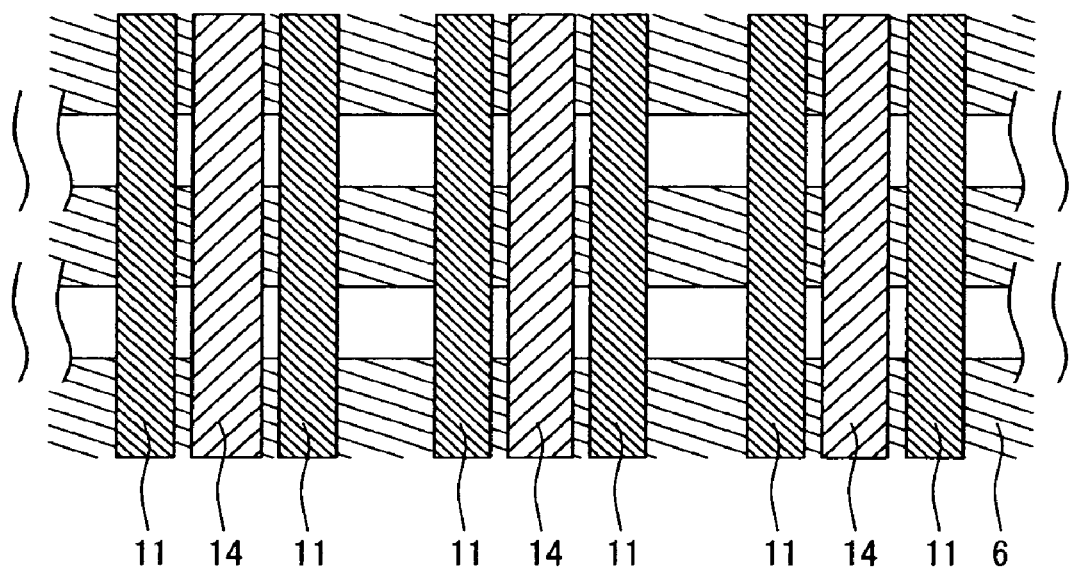
FIG. 23 is a top view illustrating a fabrication process of a semiconductor memory according to a second preferred embodiment of the present invention.

Next, the chalcogenide 101 is deposited with a thickness of 50 nm, and the tungsten 14 acting as the SL lines is deposited with a thickness of 100 nm. Subsequently, the laminated layer of the chalcogenide 101 and the tungsten 14 is fabricated by general lithography and dry-etching processes, such that the top view of FIG. 23 is provided.

Figure 24:
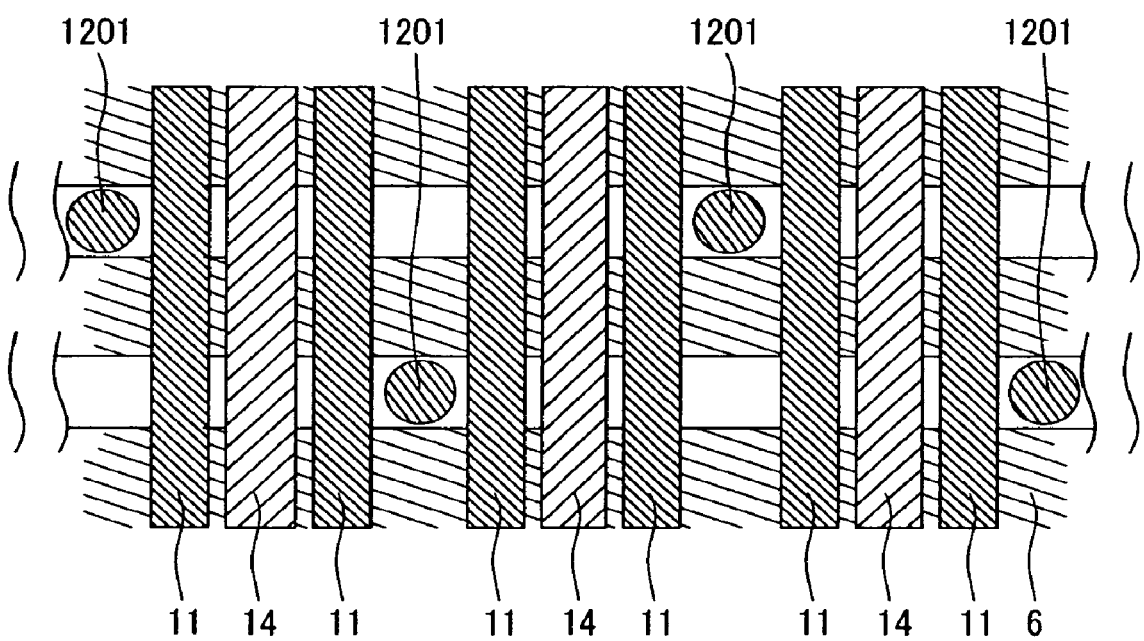
FIG. 24 is a top view illustrating a fabrication process of a semiconductor memory according to a second preferred embodiment of the present invention.
Figure 25:
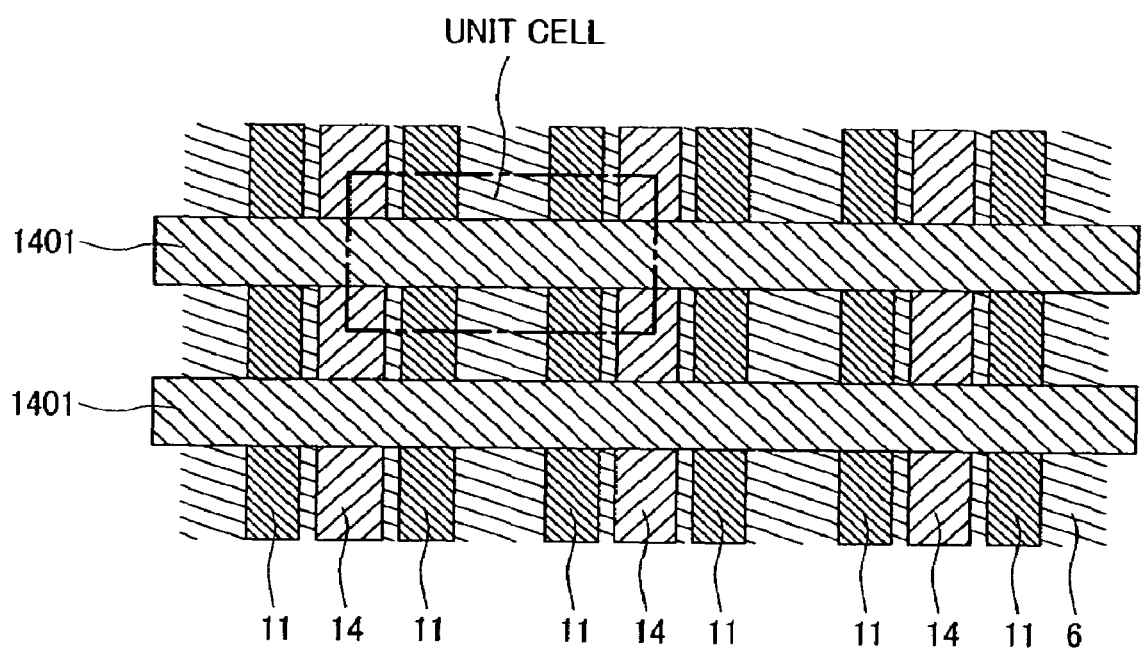
FIG. 25 is a top view illustrating a fabrication process of a semiconductor memory according to a second preferred embodiment of the present invention.

Next, the bit line is formed. Similar to the above-mentioned source lines (SL) case, in order to form an interlayer insulation layer, a silicon oxide layer is deposited with a thickness of 500 nm, and is then planarized by a general CMP process. Furthermore, in order to form a conductive plug 1201, tungsten is deposited with a thickness of 200 nm, and is planarized by the typical CMP process, such that the top view of FIG. 24 is provided. Next, tungsten 1401 acting as the BL line is deposited with a thickness of 100 nm. Subsequently, the tungsten 1401 is fabricated by general lithography and dry-etching processes, such that the top view of FIG. 25 is provided. Thereafter, a multilayer interconnection layer is formed, such that a desired semiconductor memory is implemented. In the same manner as in the first preferred embodiment, the second preferred embodiment assigns 0 or negative potential to a word line other than selected lines. Such that the word line is electrically isolated from neighboring cells.

Third Preferred Embodiment

Figure 26:
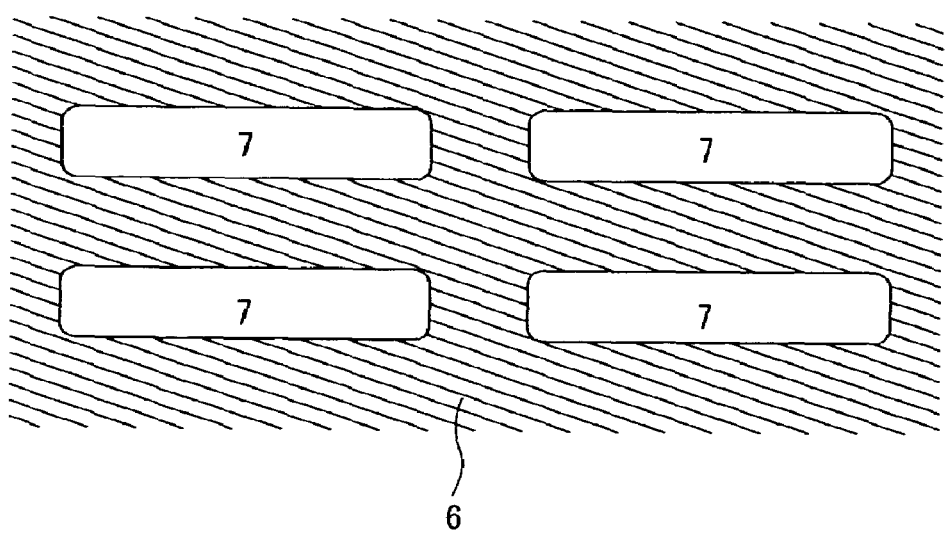
FIG. 26 is a top view illustrating a fabrication process of a semiconductor memory according to a third preferred embodiment of the present invention.
Figure 27:
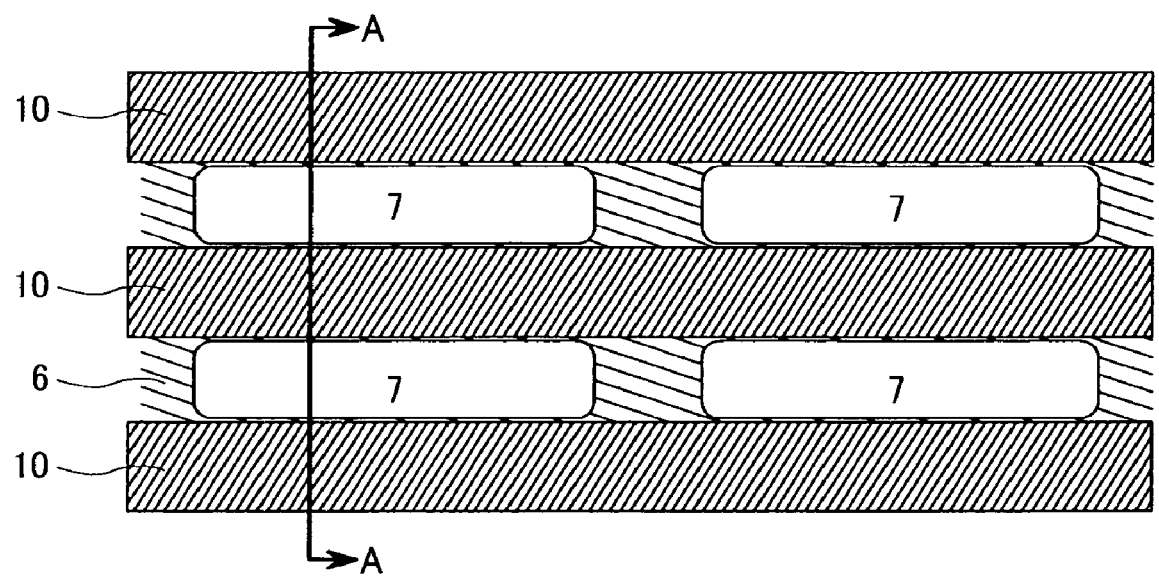
FIG. 27 is a top view illustrating a fabrication process of a semiconductor memory according to a third preferred embodiment of the present invention.
Figure 28:
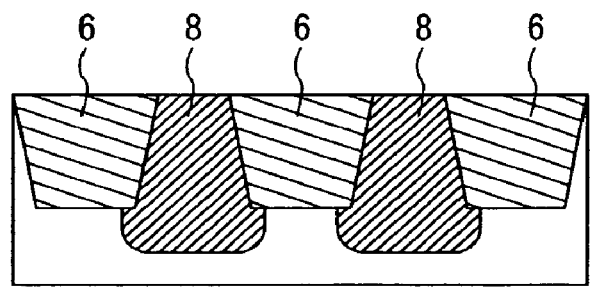
FIG. 28 is a cross-sectional view illustrating a fabrication process of a semiconductor memory according to a third preferred embodiment of the present invention.

The first and second preferred embodiments have isolated each component by a combination of a shallow trench isolation and a field plate isolation. The third preferred embodiment employs only the shallow trench isolation. The third preferred embodiment does not use a gate electric field for isolation of each component, such that it can easily control a word system, and a detailed description thereof will hereinafter be described. N-type well is formed in the memory cell array using a P-type substrate. An isolation layer shown in FIG. 26 is formed by a typical CMOS process. Next, in order to isolate a substrate potential in a direction parallel to a bit line, a resist pattern of FIG. 27 is used as a mask, and implantation of P-type impurity is executed. FIG. 28 is a cross-sectional view illustrating a semiconductor memory taken along the line A-A of FIG. 27. A diffusion layer must be thicker than the isolation layer 6, differently from the example of FIG. 6. The remaining parts other than the above-mentioned features are equal to those of the first preferred embodiment. The third preferred embodiment cannot isolate a substrate potential using a self-assignment scheme, such that it has a disadvantage in that a cell area is unavoidably increased. However, the third preferred embodiment can easily control words, such that a semiconductor memory design becomes easier, resulting in increased production yields.

Fourth Preferred Embodiment

Figure 29:
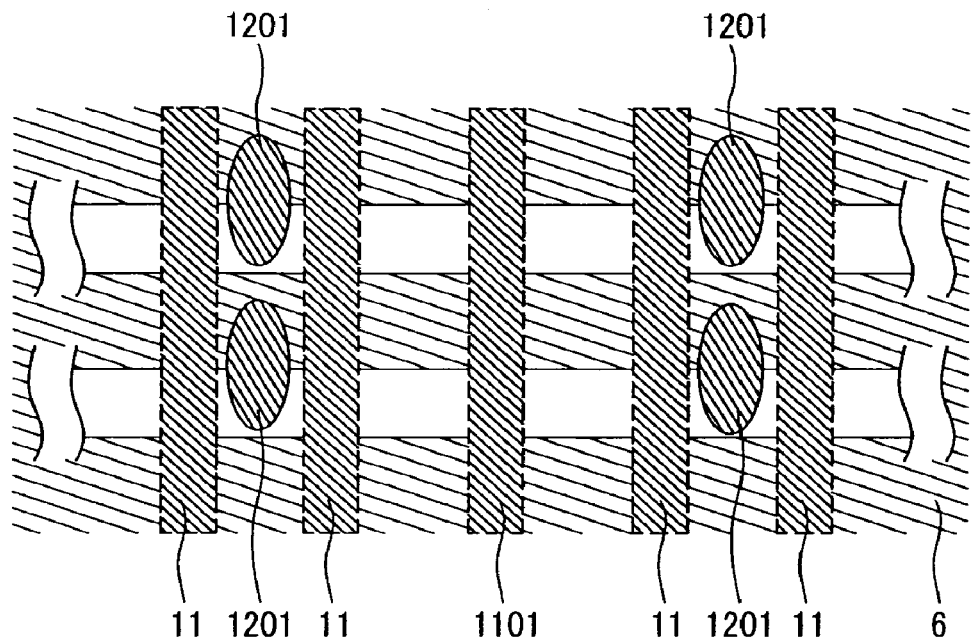
FIG. 29 is a top view illustrating a fabrication process of a semiconductor memory according to a fourth preferred embodiment of the present invention.
Figure 30:
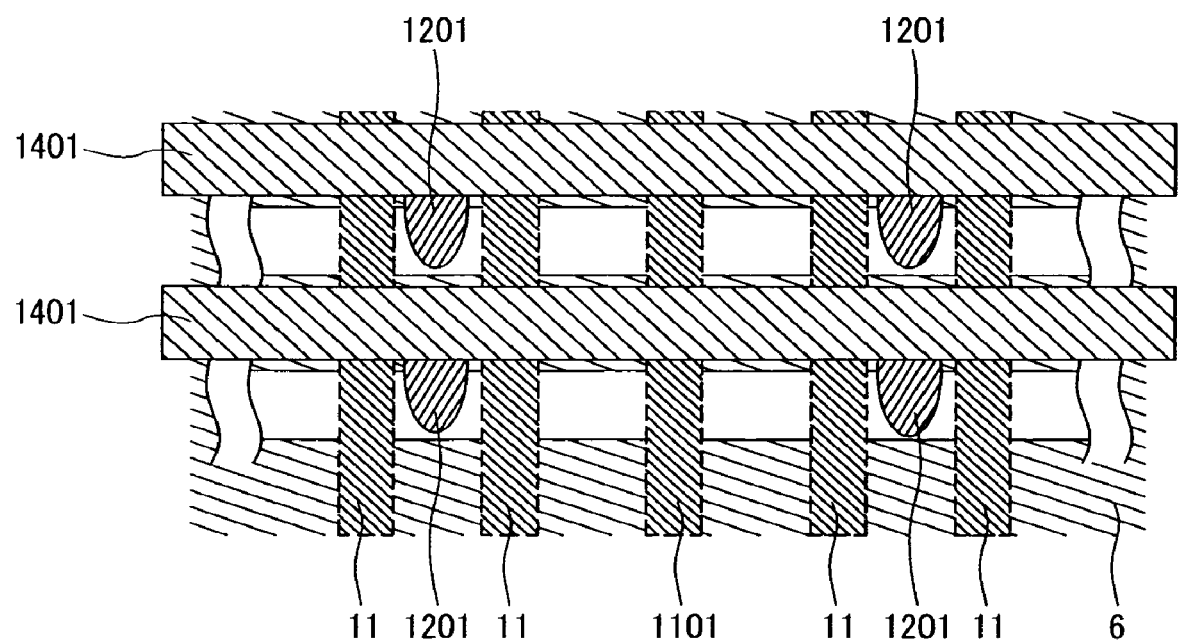
FIG. 30 is a top view illustrating a fabrication process of a semiconductor memory according to a fourth preferred embodiment of the present invention.
Figure 31:
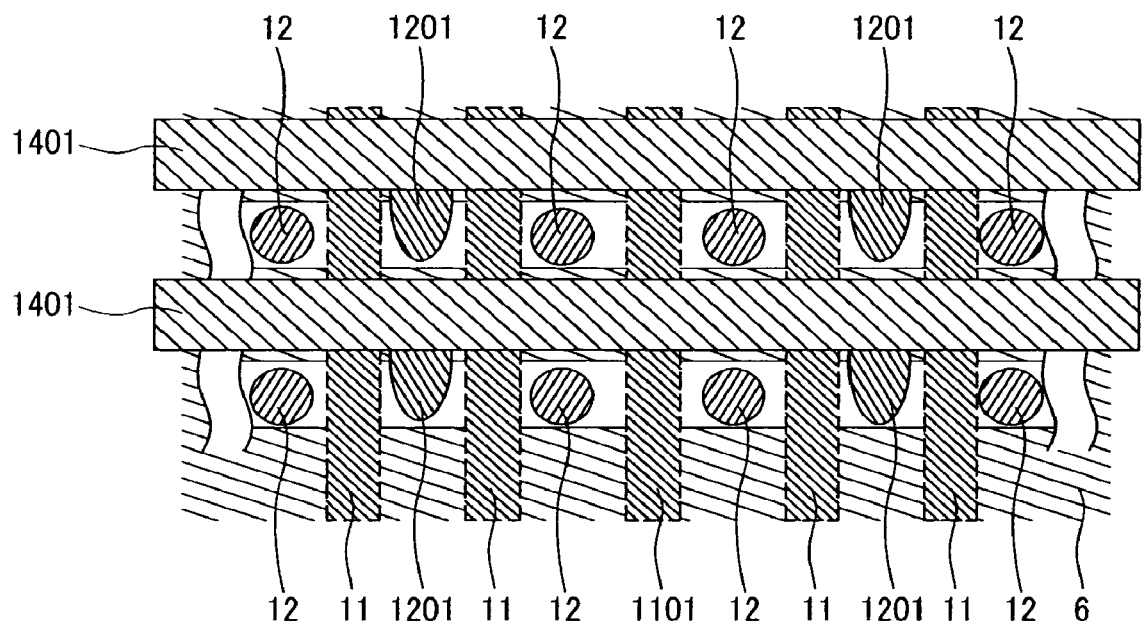
FIG. 31 is a top view illustrating a fabrication process of a semiconductor memory according to a fourth preferred embodiment of the present invention.
Figure 32:
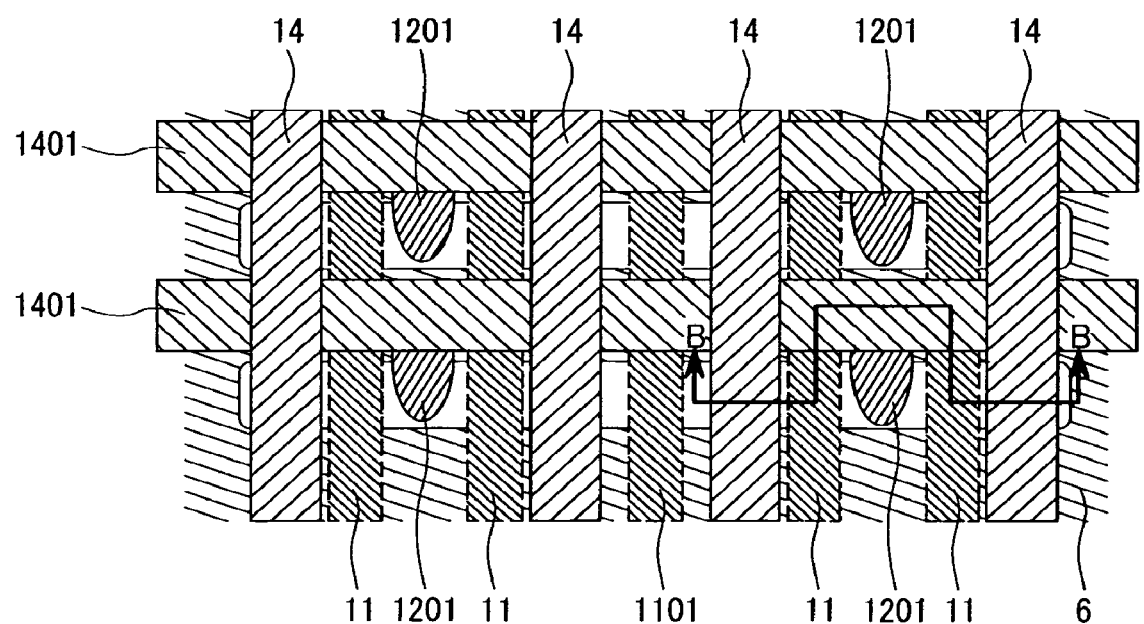
FIG. 32 is a top view illustrating a fabrication process of a semiconductor memory according to a fourth preferred embodiment of the present invention.
Figure 33:
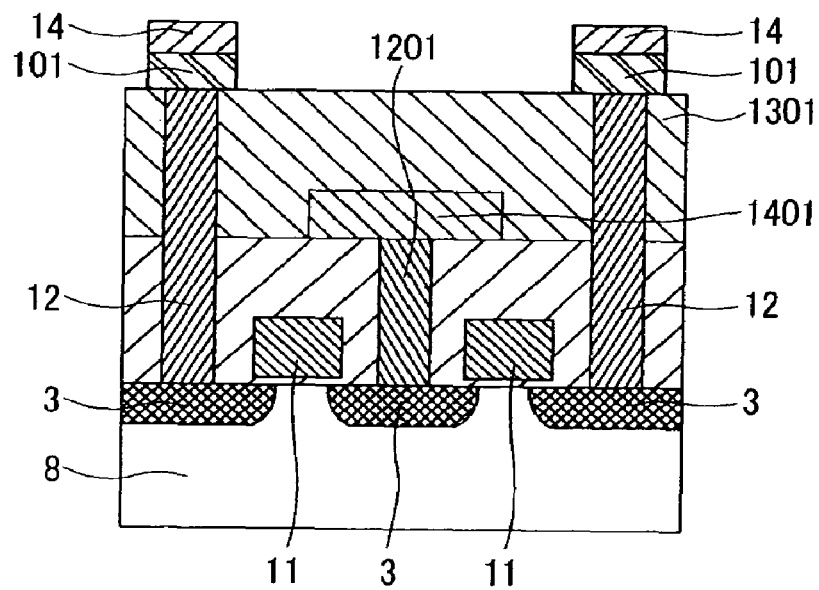
FIG. 33 is a cross-sectional view illustrating a fabrication process of a semiconductor memory according to a fourth preferred embodiment of the present invention.

The above-mentioned first, second, and third preferred embodiments have formed the bit line after the chalcogenide layer is fabricated. The fourth preferred embodiment shields the bit line by a plug connected to the chalcogenide, such that capacitance between bit lines is reduced, a detailed description thereof will hereinafter be described with reference to the annexed drawings. In the same manner as in the first preferred embodiment, the fourth preferred embodiment forms an isolation layer using a gate electric field. A method for forming the word line of the fourth preferred embodiment is equal to that of the first preferred embodiment. Next, a bit line is formed. In order to form the bit line, an elliptical plug is formed as shown in FIG. 29. Next, tungsten 1401 acting as the BL line is deposited with a thickness of 100 nm. The tungsten 1401 is fabricated by general lithography and dry-etching processes, such that the top view of FIG. 30 is provided. Thereafter, an interlayer insulation layer is formed, a contact plug 12 made of tungsten is formed for connection to the source line, such that the top view of FIG. 31 is provided. The bit-line plug 1201 is oval-shaped, and the bit lines 1401 are arranged in the form of an alternation, such that the contact plug 12 for the source lines can be formed. Then, the chalcogenide 101 is deposited with a thickness of 50 nm, and the tungsten 14 acting as the SL line is deposited with a thickness of 100 nm. Subsequently, the laminated layer of the chalcogenide 101 and the tungsten 14 is fabricated by general lithography and dry-etching processes, such that the top view of FIG. 32 is provided. FIG. 33 is a cross-sectional view illustrating the semiconductor memory taken along the line B-B of FIG. 32. As can be seen from FIGS. 32 and 33, the bit line 1401 is shielded by the plug electrode 12, such that the capacitance between bit lines can be effectively reduced. Thereafter, a multiplayer interconnection process is executed to acquire a desired semiconductor memory.

Fifth Preferred Embodiment

The above-mentioned first, second, third, and fourth preferred embodiments have deposited the chalcogenide layer on the source lines, and have connected the chalcogenide layer in a direction parallel to the word lines. The fifth preferred embodiment isolates the chalcogenide for each cell, such that it can prevent disturbance caused by heat between neighboring cells from being generated, and a detailed description thereof will hereinafter be described.

Figure 34:
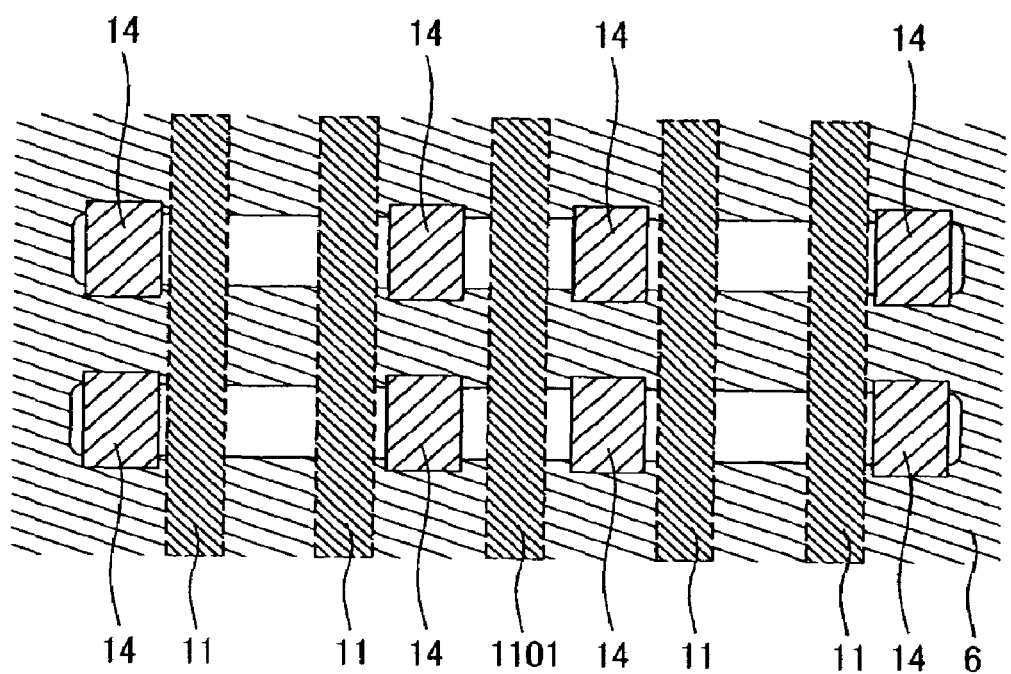
FIG. 34 is a top view illustrating a fabrication process of a semiconductor memory according to a fifth preferred embodiment of the present invention.
Figure 35:
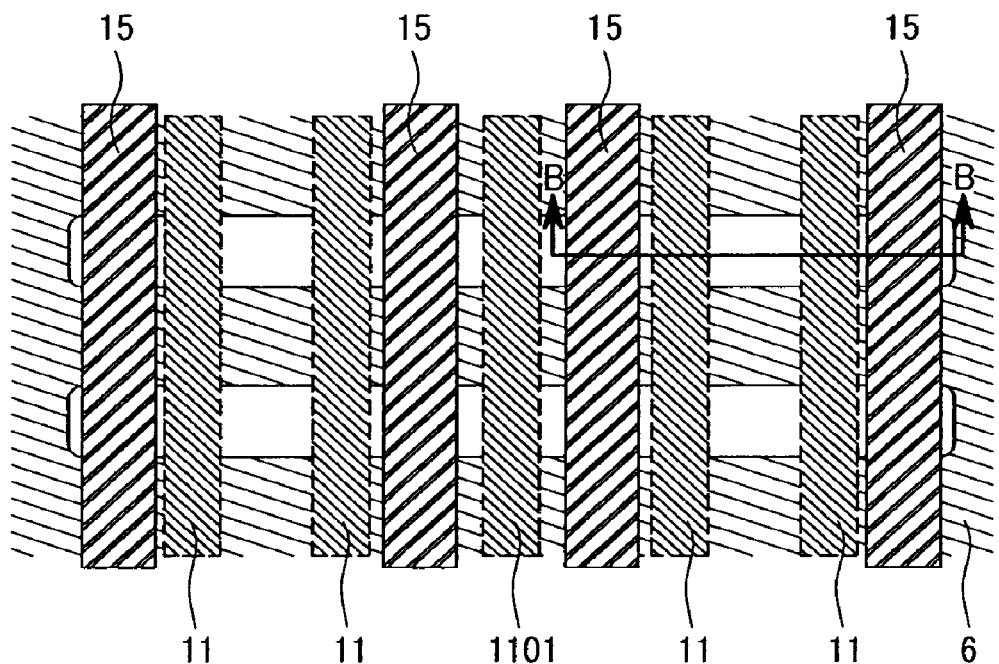
FIG. 35 is a top view illustrating a fabrication process of a semiconductor memory according to a fifth preferred embodiment of the present invention.
Figure 36:
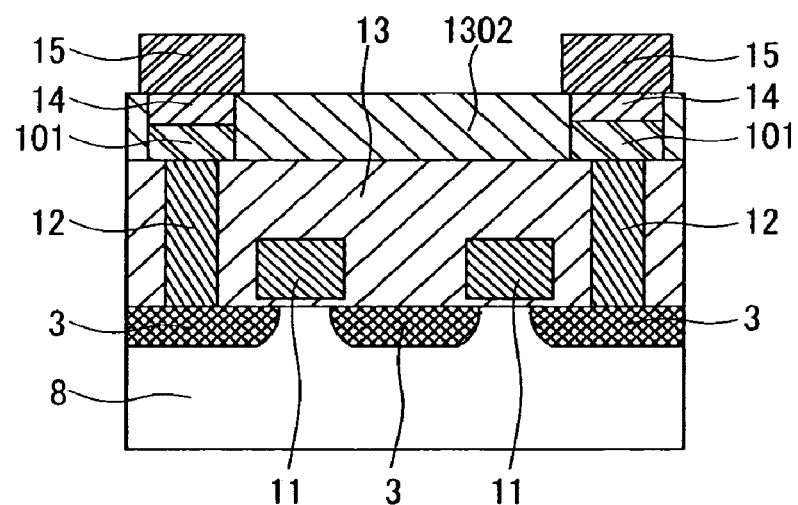
FIG. 36 is a cross-sectional view illustrating a fabrication process of a semiconductor memory according to a fifth preferred embodiment of the present invention.
Figure 37:
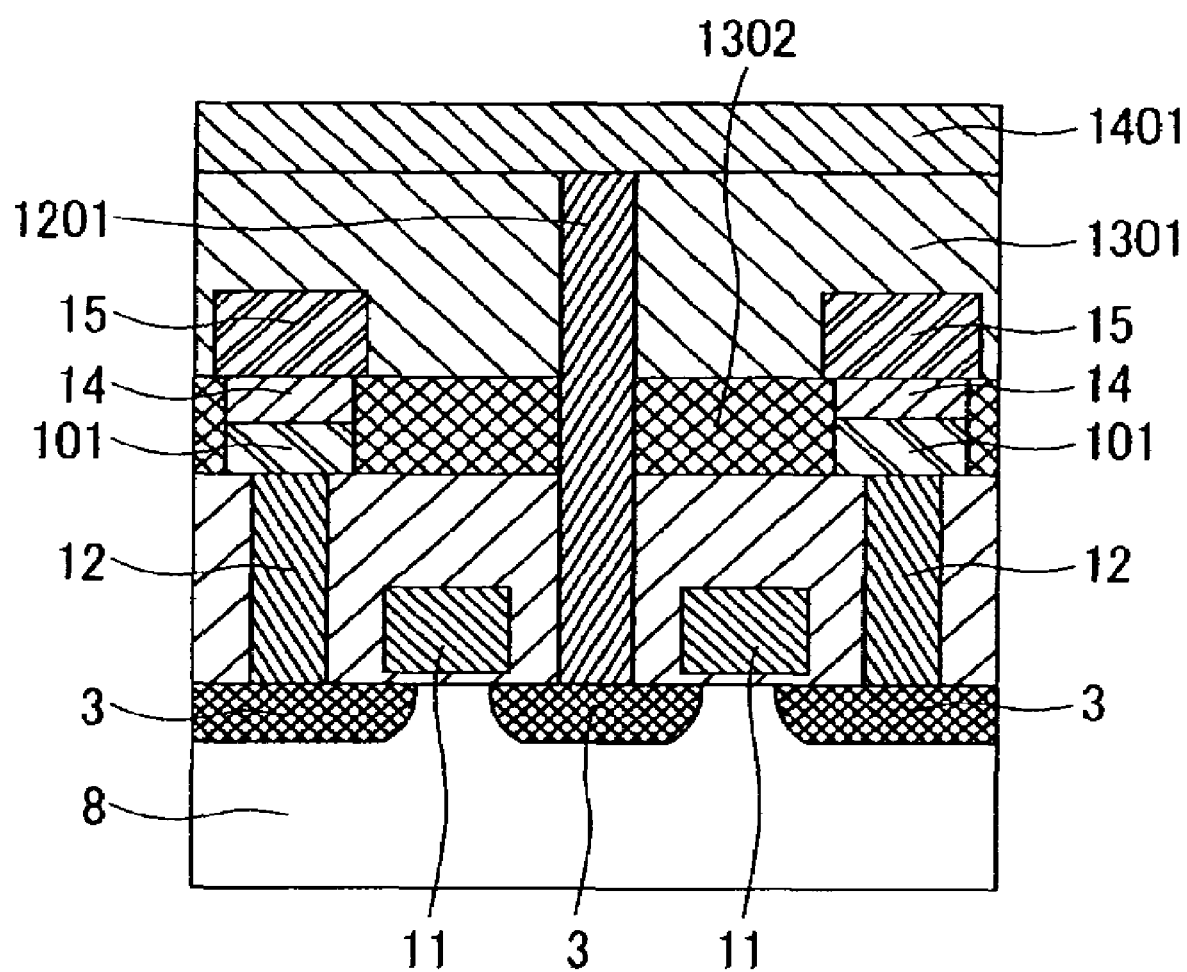
FIG. 37 is a cross-sectional view illustrating a fabrication process of a semiconductor memory according to a fifth preferred embodiment of the present invention.

A variety of processes until reaching the process for forming the plug (See FIG. 9) for source-line connection of the fifth preferred embodiment are equal to those of the first preferred embodiment. Subsequently, chalcogenide 101 is deposited with a thickness of 50 nm, and tungsten 14 is deposited with a thickness of 100 nm. The laminated layer of the chalcogenide 101 and the tungsten 14 is fabricated by general lithography and dry-etching processes, such that the top view of FIG. 34 is provided. A silicon oxide layer acting as the interlayer insulation layer 1302 is deposited with a thickness of 200 nm, and is planarized by the CMP process, such that the tungsten electrode 14 is exposed. Tungsten 15 is deposited with a thickness of 200 nm, is fabricated by general lithography and dry-etching processes, such that the top view of FIG. 35 is provided. Next, a bit line is formed. In the same manner as in the process for forming the source lines, a silicon oxide layer is deposited with a thickness of 500 nm to form an interlayer insulation layer, and is planarized by a general CMP process. In order to form the conductive plug 1201, the contact is exposed, the tungsten is deposited with a thickness of 200 nm, and is planarized by general CMP process. Next, the tungsten 1401 acting as the bit line is deposited with a thickness of 100 nm. Subsequently, the tungsten 1401 is fabricated by general lithography and dry-etching processes, such that the cross-section view of FIG. 37 is provided. Thereafter, a multiplayer interconnection process is executed to acquire a desired semiconductor memory.

INDUSTRIAL APPLICABILITY

As apparent from the above description, a semiconductor memory according to the present invention can implement a high-speed non-volatile memory capable of preventing the read disturbance from being generated, and can be applied to microprocessors for vehicles or IC cards.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A semiconductor device comprising:
    first and second word lines;
    first and second source lines;
    first and second bit lines each crossing the first word line, the second word line, the first source line, and the second source line;
    a first memory cell including a first MISFET having a gate connected with the first word line and having a source and a drain, one of the source and the drain of the first MISFET being connected with the first bit line, and a first variable resistor element, one side of the first variable resistor element being connected with the other of the source and the drain of the first MISFET and another side of the first variable resistor element being connected with the first source line;
    a second memory cell including a second MISFET having a gate connected with the first word line and having a source and a drain, one of the source and the drain of the second MISFET being connected with the second bit line, and a second variable resistor element, one side of the second variable resistor element being connected with the other of the source and the drain of the second MISFET and another side of the second variable resistor element being connected with the first source line;
    a third memory cell including a third MISFET having a gate connected with the second word line and having a source and a drain, one of the source and the drain of the third MISFET being connected with the first bit line, and a third variable resistor element, one side of the third variable resistor element being connected with the other of the source and the drain of the third MISFET and another side of the third variable resistor element being connected with the second source line;
    a fourth memory cell including a fourth MISFET having a gate connected with the second word line and having a source and a drain, one of the source and the drain of the fourth MISFET being connected with the second bit line, and a fourth variable resistor element, one side of the fourth variable resistor element being connected with the other of the source and the drain of the fourth MISFET and another side of the fourth variable resistor element being connected with the second source line;
    a first substrate node connected with the source and the drain of the first MISFET and the source and the drain of the third MISFET; and
    a second substrate node connected with the source and the drain of the second MISFET and the source and the drain of the fourth MISFET, wherein a current flows between the first substrate node and the first source line via the first variable resistor element when data is written into the first memory cell, and
    wherein a first voltage is supplied to the first substrate node, and then a second voltage lower than the first voltage or a third voltage lower than the second voltage is supplied to the first source line, and then the second voltage or the third voltage is supplied to the second source line when data is written into the first memory cell and then data is written into the third memory cell.

2. A semiconductor device according to claim 1,
    wherein the second voltage is supplied to the first source line when a first information is written into the first memory cell,
    wherein the third voltage is supplied to the first source line when a second information different from the first information is written into the first memory cell,
    wherein the second voltage is supplied to the second source line when the first information is written into the third memory cell, and
    wherein the third voltage is supplied to the second source line when the second information is written into the third memory cell.

3. A semiconductor device according to claim 1,
    wherein the first voltage is supplied to the first bit line when data is written into the first memory cell and then data is written into the third memory cell.

4. A semiconductor device according to claim 1,
    wherein a fourth voltage lower than a ground potential is supplied to the first word line during the second voltage or the third voltage being supplied to the first source line, and
    wherein the fourth voltage is supplied to the second word line during the second voltage or the third voltage being supplied to the second source line.

5. A semiconductor device according to claim 1,
    wherein the third voltage is supplied to the second substrate node when data is written into the first memory cell and then data is written into the third memory cell.

6. A semiconductor device according to claim 4,
    wherein a fifth voltage higher than the second voltage is supplied to the second bit line when data is written into the first memory cell and then data is written into the third memory cell.

7. A semiconductor device according to claim 1,
    wherein the first, second, third and fourth variable resistor is a phase-change element.

* * * * *